US012382743B2

(12) United States Patent
Katayama

(10) Patent No.: US 12,382,743 B2
(45) Date of Patent: Aug. 5, 2025

(54) SOLID-STATE IMAGING DEVICE WITH ENHANCED PIXEL STRUCTURE AND LIGHT SHIELDING REGION FOR IMPROVING IMAGE QUALITY

(71) Applicant: SONY SEMICONDUCTOR SOLUTIONS CORPORATION, Kanagawa (JP)

(72) Inventor: Hiroshi Katayama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 376 days.

(21) Appl. No.: 17/758,338

(22) PCT Filed: Dec. 16, 2020

(86) PCT No.: PCT/JP2020/047032
§ 371 (c)(1),
(2) Date: Jul. 1, 2022

(87) PCT Pub. No.: WO2021/145127
PCT Pub. Date: Jul. 22, 2021

(65) Prior Publication Data
US 2023/0044832 A1   Feb. 9, 2023

(30) Foreign Application Priority Data

Jan. 16, 2020 (JP) .................. 2020-004989

(51) Int. Cl.
*H10F 39/00* (2025.01)
*H10F 39/18* (2025.01)

(52) U.S. Cl.
CPC ....... *H10F 39/8063* (2025.01); *H10F 39/182* (2025.01); *H10F 39/8053* (2025.01); *H10F 39/8057* (2025.01)

(58) Field of Classification Search
CPC ......... H01L 27/14627; H01L 27/14621; H01L 27/14623; H01L 27/14645; H01L 27/1463;
(Continued)

(56) References Cited

U.S. PATENT DOCUMENTS

2011/0273597 A1* 11/2011 Ishiwata ................ H04N 23/54
348/E9.002
2014/0367817 A1* 12/2014 Furuta ............... H01L 27/14629
257/432
(Continued)

FOREIGN PATENT DOCUMENTS

CN   104969540 A   10/2015
CN   110036631 A    7/2019
(Continued)

OTHER PUBLICATIONS

International Search Report and Written Opinion of PCT Application No. PCT/JP2020/047032, issued on Mar. 2, 2021, 09 pages of ISRWO.

*Primary Examiner* — Georgia Y Epps
*Assistant Examiner* — Erin R Garber
(74) *Attorney, Agent, or Firm* — CHIP LAW GROUP

(57) ABSTRACT

An object of the present disclosure is to provide a solid-state imaging device capable of suppressing deterioration of image quality. The solid-state imaging device includes: a first pixel that has a plurality of photoelectric conversion units sharing a first color filter with each other and a plurality of on-chip lenses; a second pixel that is arranged adjacent to the first pixel and has a plurality of photoelectric conversion units sharing a second color filter with each other and a plurality of on-chip lenses; and a first light shielding region that is provided between the first pixel and the second pixel.

16 Claims, 20 Drawing Sheets

(58) Field of Classification Search
CPC .............. H01L 27/14625; H04N 23/12; H04N 25/134; H10F 39/8063; H10F 39/182; H10F 39/8053; H10F 39/8057
See application file for complete search history.

(56) References Cited

U.S. PATENT DOCUMENTS

| | | |
|---|---|---|
| 2016/0276396 A1 | 9/2016 | Tayanaka et al. |
| 2017/0201726 A1 | 7/2017 | Yorikado |
| 2020/0083263 A1* | 3/2020 | Tanaka .............. H01L 27/14603 |
| 2020/0243579 A1* | 7/2020 | Pyo .................. H01L 27/14627 |
| 2021/0175270 A1* | 6/2021 | Pang ................ H01L 27/14605 |
| 2021/0202546 A1* | 7/2021 | Liu .................... H01L 27/1463 |
| 2023/0238404 A1* | 7/2023 | Shiraishi ............... H01L 27/146 257/431 |

FOREIGN PATENT DOCUMENTS

| | | | | |
|---|---|---|---|---|
| JP | 2011-239070 A | 11/2011 | | |
| JP | 2015-133469 A | 7/2015 | | |
| JP | 2019-197839 A | 11/2019 | | |
| WO | 2015/087515 A2 | 6/2015 | | |
| WO | 2017/154605 A1 | 9/2017 | | |
| WO | WO-2018221443 A1 * | 12/2018 | .............. | G02B 7/34 |
| WO | 2019/003681 A1 | 1/2019 | | |
| WO | WO-2019111373 A1 * | 6/2019 | .......... | H01L 27/146 |
| WO | 2019/216007 A1 | 11/2019 | | |

\* cited by examiner

SOLID-STATE IMAGING DEVICE WITH ENHANCED PIXEL STRUCTURE AND LIGHT SHIELDING REGION FOR IMPROVING IMAGE QUALITY

CROSS REFERENCE TO RELATED APPLICATIONS

This application is a U.S. National Phase of International Patent Application No. PCT/JP2020/047032 filed on Dec. 16, 2020, which claims priority benefit of Japanese Patent Application No. JP 2020-004989 filed in the Japan Patent Office on Jan. 16, 2020. Each of the above-referenced applications is hereby incorporated herein by reference in its entirety.

TECHNICAL FIELD

The present disclosure relates to a solid-state imaging device having a photoelectric conversion unit that converts incident light into an electric signal.

BACKGROUND ART

Quad Bayer coding in which one pixel is constituted by sub pixels arranged in two rows and two columns is known (for example, PTL 1).

CITATION LIST

Patent Literature

[PTL 1]
JP 2011-239070 A

SUMMARY

Technical Problem

Quad Bayer coding has a problem that flare and color mixing is poor and image quality deteriorates because oblique incidence characteristics deteriorate as compared with a normal structure in which one pixel is constituted by one photoelectric conversion element. In particular, in a large-size type of a solid-state imaging device, a chip size is large, and thus image quality significantly deteriorates due to the deterioration of the oblique incidence characteristics. Further, in a cellular type, pupil correction is applied strongly at a high image height, and thus image quality significantly deteriorates due to the deterioration of the oblique incidence characteristics.

An object of the present disclosure is to provide a solid-state imaging device capable of suppressing deterioration of image quality.

Solution to Problem

In order to achieve the object, a solid-state imaging device according an aspect of the present disclosure includes: a first pixel that has a plurality of photoelectric conversion units sharing a first color filter with each other and a plurality of on-chip lenses; a second pixel that is arranged adjacent to the first pixel and has a plurality of photoelectric conversion units sharing a second color filter with each other and a plurality of on-chip lenses; and a first light shielding region that is provided between the first pixel and the second pixel.

DESCRIPTION OF EMBODIMENTS

Hereinafter, modes (embodiments) for carrying out the present disclosure will be described in detail with reference to the drawings. The following description is a specific example of the present disclosure, and the present disclosure is not limited to the following aspects.

First Embodiment

A solid-state imaging device according to a first embodiment of the present disclosure will be described with reference to FIGS. 1 to 5. First, the overall schematic configuration of the solid-state imaging device according to the present embodiment will be described, and then a configuration of a pixel provided in the solid-state imaging device will be described.

<Overall Configuration of Solid-State Imaging Device>

Figure 1:
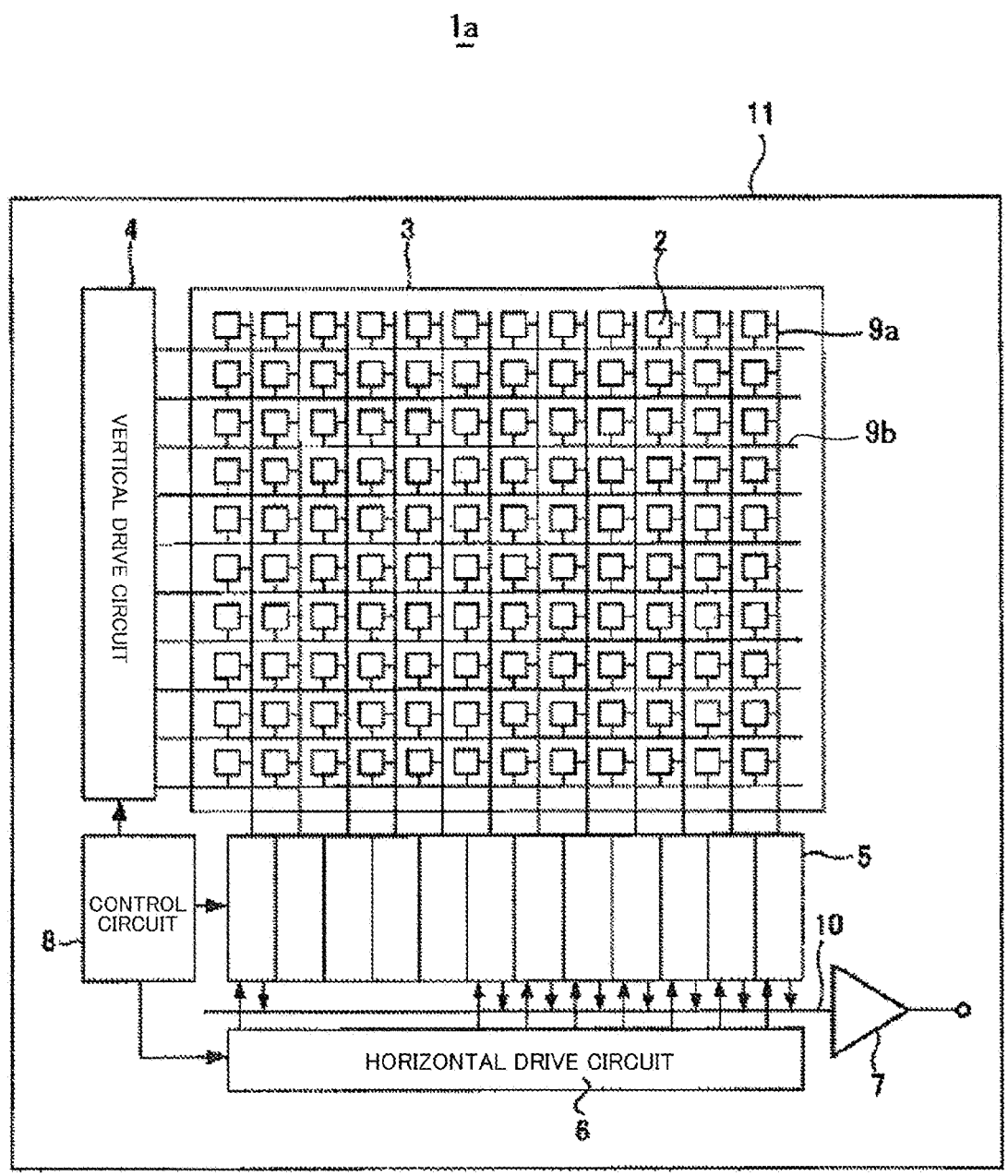
FIG. 1 is a block diagram showing an example of a schematic configuration of a solid-state imaging device according to each embodiment of the present disclosure.

As shown in FIG. 1, the solid-state imaging device 1a of the present embodiment includes a pixel region 3 having a plurality of pixels 2 arranged on a support substrate 11 formed of silicon, a vertical drive circuit 4, column signal processing circuits 5, a horizontal drive circuit 6, an output circuit 7, a control circuit 8, and the like.

Each of the pixels 2 has, for example, a photoelectric conversion unit constituted by a photodiode and a plurality of pixel transistors. The plurality of pixels 2 are regularly arranged in a two-dimensional array form on the support substrate 11. The pixel transistors constituting the pixel 2 may be four MOS transistors constituted by a transfer transistor, a reset transistor, a selection transistor, and an amplification transistor (all not shown), or may be three transistors excluding the selection transistor.

The pixel region 3 has the plurality of pixels 2 arranged regularly in a two-dimensional array form. The pixel region 3 has an effective pixel region in which light is actually received and signal charges generated by photoelectric conversion are amplified to be read by the column signal processing circuits 5 and a black reference pixel region (not shown) for outputting optical black that serves as a reference for a black level. The black reference pixel region is formed in, for example, an outer peripheral portion of the effective pixel region.

The control circuit 8 generates a clock signal, a control signal, and the like as a reference for operations of the vertical drive circuit 4, the column signal processing circuits 5, the horizontal drive circuit 6, and the like on the basis of a vertical synchronization signal, a horizontal synchronization signal, and a master clock. The clock signal, the control signal, and the like generated by the control circuit 8 are input to the vertical drive circuit 4, the column signal processing circuit 5, the horizontal drive circuit 6, and the like.

The vertical drive circuit 4 is constituted by a shift register, for example. The vertical drive circuit 4 outputs a selection signal to a selection signal line 9b in units of rows and sequentially and selectively scans the plurality of pixels 2 provided in the pixel region 3 in a vertical direction. Although not shown, the vertical drive circuit 4 outputs a reset signal to a reset signal line arranged in parallel with the selection signal line 9b and sequentially resets the plurality of pixels 2 in the vertical direction in unit of rows. Therefore, a pixel signal based on the signal charges generated in the photodiode of each of the plurality of pixels 2 according to the intensity of the light received is supplied to the column signal processing circuit 5 through a vertical signal line.

The column signal processing circuit 5 is arranged, for example, for each column of the pixel 2, and the signal output from the pixel 2 for one row via a vertical signal line 9a is subjected to signal processing such as noise removal and signal amplification using the signal from the black reference pixel region (not shown, but formed around the effective pixel region) for each pixel column. A horizontal selection switch (not shown) is provided between an output stage of the column signal processing circuit 5 and a horizontal signal line 10.

The horizontal drive circuit 6 is constituted by, for example, shift registers, and sequentially outputs a horizontal scanning pulse and thus selects each of the column signal processing circuits 5 in order, and outputs a pixel signal from each of the column signal processing circuits 5 to the horizontal signal line 10.

The output circuit 7 performs signal processing on the signal sequentially supplied from each of the column signal processing circuits 5 through the horizontal signal line 10 and outputs it.

<Configuration of Pixel Provided in Solid-State Imaging Device>

Figure 2:
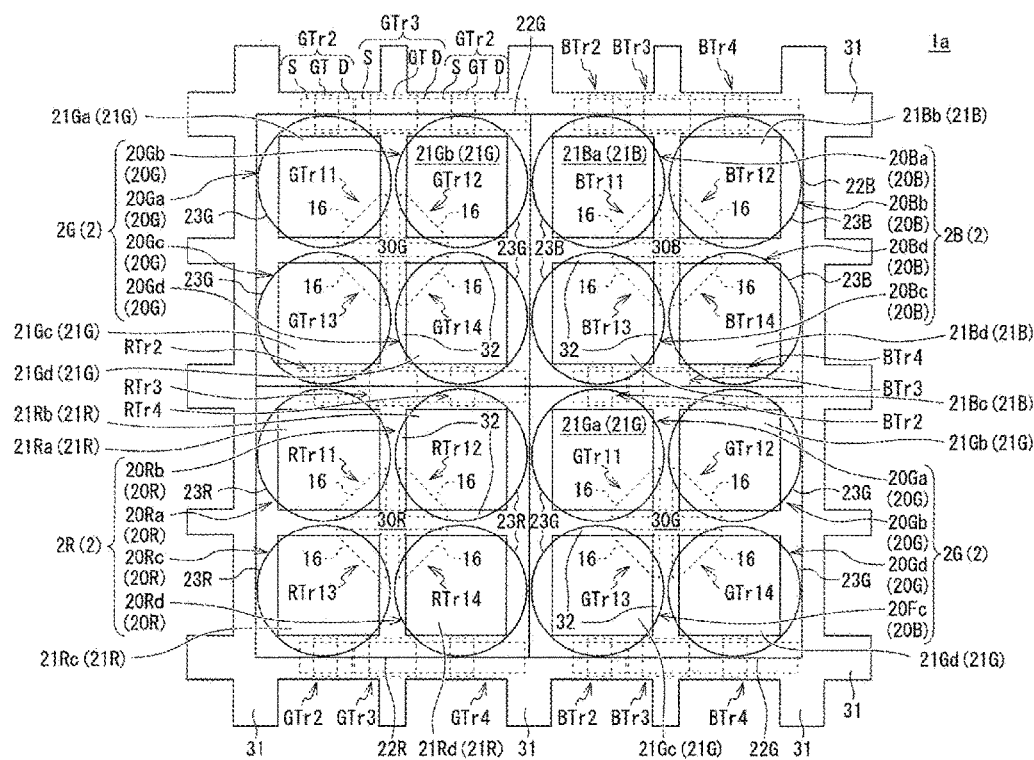
FIG. 2 is a plan view showing an example of a schematic configuration of pixels provided in a solid-state imaging device according to a first embodiment of the present disclosure.
Figure 3:
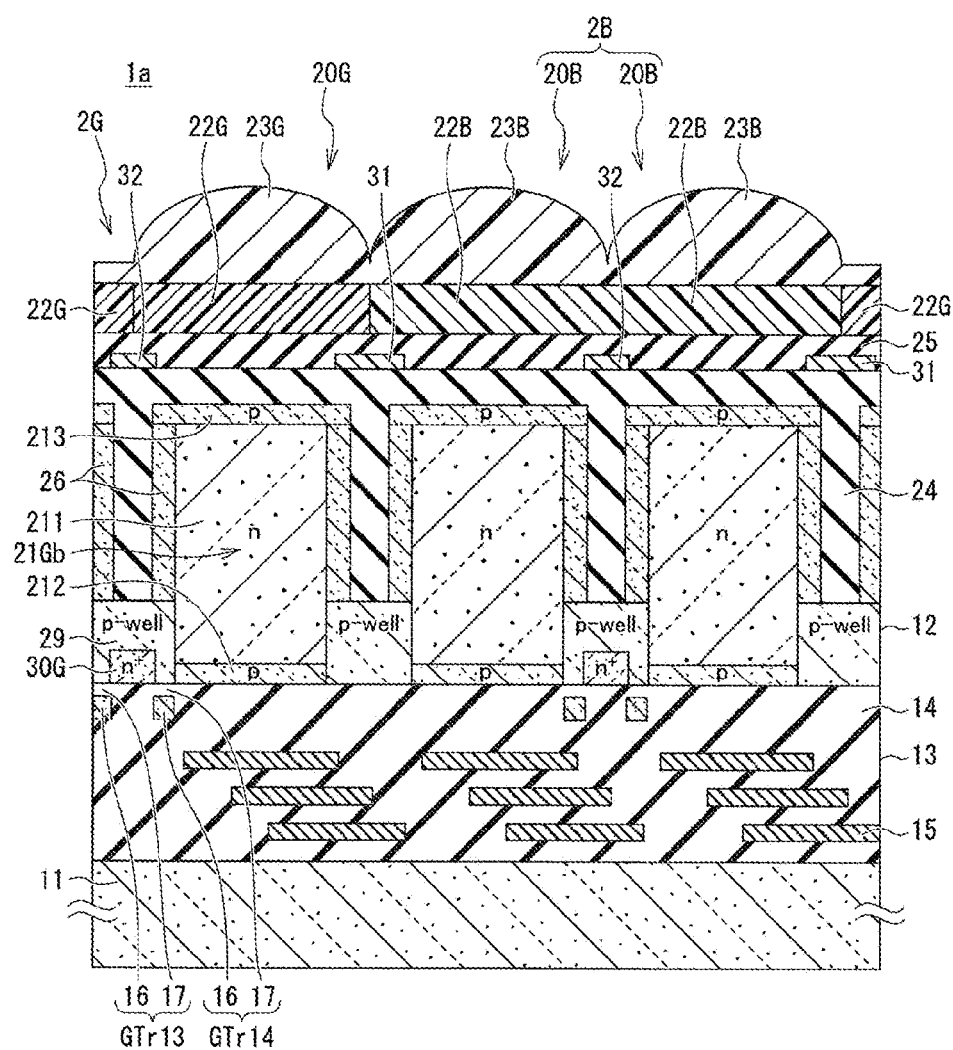
FIG. 3 is a cross-sectional view showing an example of a schematic configuration of the pixels provided in the solid-state imaging device according to the first embodiment of the present disclosure.
Figure 4:
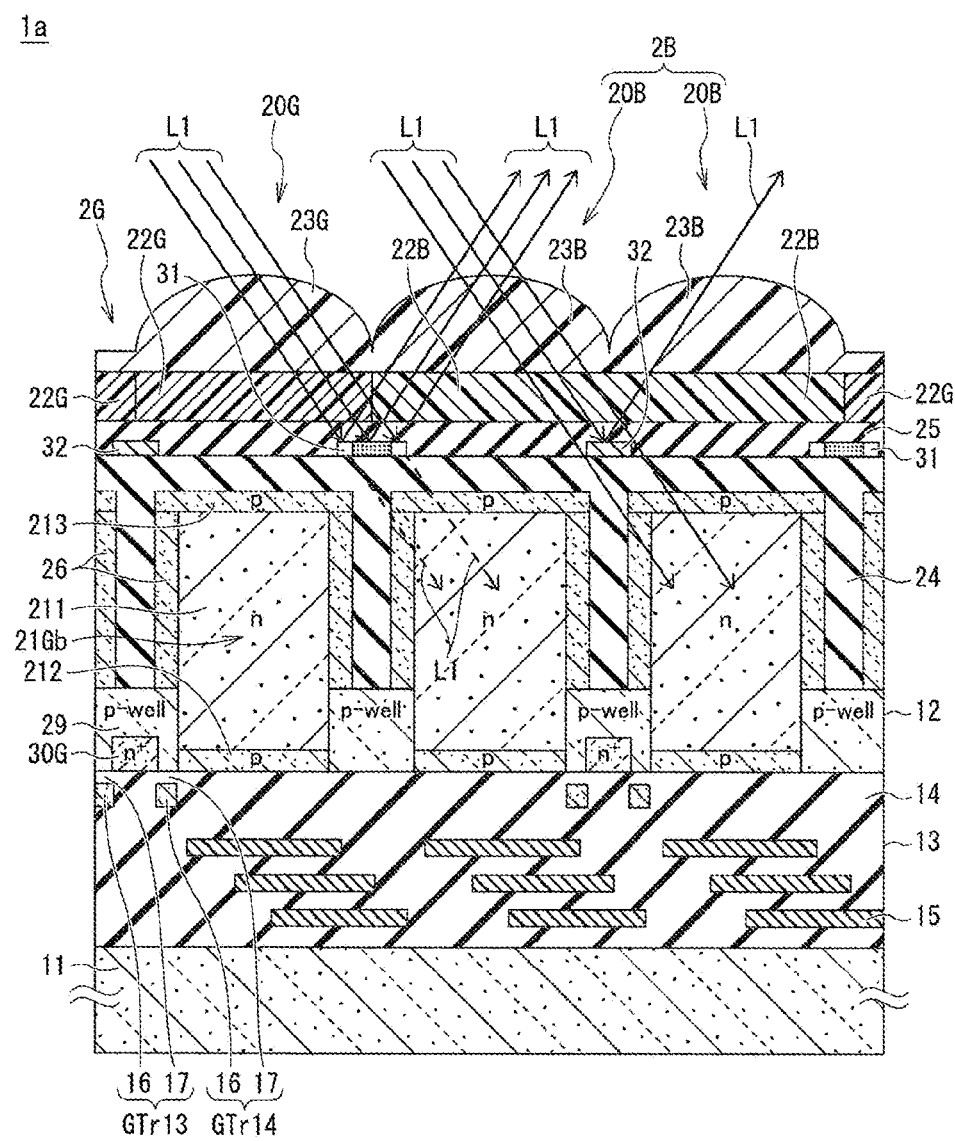
FIG. 4 is a view for showing an effect of the solid-state imaging device according to the first embodiment of the present disclosure.

The solid-state imaging device 1a according to the present embodiment will be described by taking a back-illuminated CMOS-type solid-state imaging device as an example. The solid-state imaging device 1a has a pixel structure in which so-called four-pixel sharing in which four photoelectric conversion units share a required pixel transistor with each other is set as one unit. FIG. 2 is a plan view showing an example of a schematic configuration in which four adjacent pixels 2 out of the plurality of pixels 2 arranged in the pixel region 3 (see FIG. 1) are extracted. FIG. 3 is a cross-sectional view showing an example of a schematic configuration of a green sub pixel and two blue sub pixels which are adjacent (details of the sub pixel will be described later). FIG. 4 is a circuit diagram showing an example of a circuit configuration of a sub pixel.

As shown in FIGS. 2 and 3, the solid-state imaging device 1a has a plurality of (four in the present embodiment) photoelectric conversion units 21G (an example of a first photoelectric conversion unit) sharing a green filter (an example of a first color filter) 22G with each other and a plurality of (four in the present embodiment) on-chip lenses 23G. The plurality of on-chip lenses 23G are arranged on one side of the green filter 22G, and the plurality of photoelectric conversion units 21G are arranged on the other side of the green filter 22G. One side of the green filter 22G is a back surface side of the solid-state imaging device 1a and is also a light incidence side where light enters from the outside. The other side of the green filter 22G is a front surface side of the solid-state imaging device 1a and is also a side opposite to the light incidence side.

The solid-state imaging device 1a has blue sub pixels (an example of a second sub pixel) 20B having a plurality of (four in the present embodiment) photoelectric conversion units 21B (an example of a second photoelectric conversion unit) that are arranged adjacent to the green filter 22G and share a blue filter (an example of a second color filter) 22B with each other and a plurality of (four in the present embodiment) on-chip lenses 23B. The plurality of on-chip lenses 23B are arranged on one side of the blue filter 22B, and the plurality of photoelectric conversion units 21B are arranged on the other side of the blue filter 22B. One side of the blue filter 22B is a back surface side of the solid-state imaging device 1a and is also a light incidence side where light enters from the outside. The other side of the blue filter 22B is a front surface side of the solid-state imaging device 1a and is also a side opposite to the light incidence side.

As shown FIG. 2, the solid-state imaging device 1a has a plurality of (four in the present embodiment) photoelectric conversion units 21R (an example of a second photoelectric conversion unit) that are arranged adjacent to the green filter 22G and share a red filter (an example of a second color filter) 22R with each other and a plurality of (four in the present embodiment) on-chip lenses 23R. The plurality of on-chip lenses 23R are arranged on one side of the red filter 22R, and the plurality of photoelectric conversion units 21R are arranged on the other side of the red filter 22R. One side of the red filter 22R is a back surface side of the solid-state imaging device 1a and is also a light incidence side where light enters from the outside. The other side of the red filter 22R is a front surface side of the solid-state imaging device 1a and is also a side opposite to the light incidence side.

Hereinafter, in cases where a red pixel 2R, a green pixel 2G, and a blue pixel 2B are described without distinction, they are collectively referred to as a "pixel 2". Looking at the four adjacent pixels 2, two green pixels 2G are arranged diagonally, and the red pixel 2R and the blue pixel 2B are arranged diagonally. In the pixel region 3 of the solid-state imaging device 1a, pixels each having one red pixel 2R, two green pixels 2G, and one blue pixel 2B as one unit are arranged side by side in a vertical direction and a horizontal direction. That is, the red pixel 2R, the green pixel 2G, and the blue pixel 2B are arranged in a Bayer array in the pixel region 3.

As shown in FIGS. 2 and 3, the solid-state imaging device 1a has a first light shielding region 31 provided between the green pixel 2G and the blue pixel 2B. Further, the solid-state imaging device 1a has a first light shielding region 31 provided between the green pixel 2G and the red pixel 2R. The first light shielding region 31 is provided to straddle the green pixel 2G and the blue pixel 2B between the green filter 22G and the photoelectric conversion unit 21G and between the blue filter 22B and the photoelectric conversion unit 21B and is provided along a boundary between the green pixel 2G and the blue pixel 2B. Further, the first light shielding region 31 is provided to straddle the green pixel 2G and the red pixel 2R between the green filter 22G and the photoelectric conversion unit 21G and between the red filter 22R and the photoelectric conversion unit 21R and is provided along a boundary between the green pixel 2G and the red pixel 2R.

As a result, focusing on one unit of one red pixel 2R, two green pixels 2G, and one blue pixel 2B, the first light shielding region 31 is arranged in a cross shape in the one unit. Incidentally, the green pixel 2G is sandwiched between the blue pixels 2B in a direction in which the vertical signal lines 9a are lined up. Incidentally, the green pixel 2G is sandwiched between the red pixels 2R in a direction in which the selection signal lines 9b are lined up. Therefore, focusing on one unit of one red pixel 2R, two green pixels 2G, and one blue pixel 2B, the first light shielding region 31 is arranged to surround the one unit. As described above, focusing on one unit of one red pixel 2R, two green pixels 2G, and one blue pixel 2B, the first light shielding region 31 is arranged in a grid shape.

As shown in FIGS. 2 and 3, the green pixel 2G has a green sub pixel 20Ga (an example of a first sub pixel) having a photoelectric conversion unit 21Ga (an example of a first photoelectric conversion unit) among the plurality of photoelectric conversion units 21G, a green sub pixel 20Gd (an example of a first sub pixel) having a photoelectric conversion unit 21Gd (an example of a first photoelectric conversion unit) among the plurality of photoelectric conversion units 21G, a green sub pixel 20Gb (an example of a second sub pixel) having a photoelectric conversion unit 21Gb (an example of a second photoelectric conversion unit) among the plurality of photoelectric conversion units 21G, and a green sub pixel 20Gc (an example of a second sub pixel) having a photoelectric conversion unit 21Gc (an example of a second photoelectric conversion unit) among the plurality of photoelectric conversion units 21G. Hereinafter, in a case where the green sub pixel 20Ga, the green sub pixel 20Gb, the green sub pixel 20Gc, and the green sub pixel 20Gd are described without distinction, they are collectively referred to as a "green sub pixel 20G". Further, in a case where the photoelectric conversion unit 21Ga, the photoelectric conversion unit 21Gb, the photoelectric conversion unit 21Gc, and the photoelectric conversion unit 21Gd are described without distinction, they are collectively referred to as a "photoelectric conversion unit 21G".

The green pixel 2G has a second light shielding region 32 provided between the green sub pixel 20Ga and the photoelectric conversion unit 21Gb. The green pixel 2G has a second light shielding region 32 provided between the green sub pixel 20Ga and the photoelectric conversion unit 21Gc. The green pixel 2G has a second light shielding region 32 provided between the green sub pixel 20Gd and the photoelectric conversion unit 21Gb. The green pixel 2G has a second light shielding region 32 provided between the green sub pixel 20Gd and the photoelectric conversion unit 21Gc. A width of the second light shielding region 32 provided in the green pixel 2G is narrower than a width of the first light shielding region 31.

The second light shielding region 32 provided in the green pixel 2G is provided between the green filter 22G and each of the photoelectric conversion unit 21Ga and the photoelectric conversion unit 21Gb which are adjacent to each other, the photoelectric conversion unit 21Gb and the photoelectric conversion unit 21Gd which are adjacent to each other, the photoelectric conversion unit 21Gd and the photoelectric conversion unit 21Gc which are adjacent to each other, and the photoelectric conversion unit 21Gc and the photoelectric conversion unit 21Ga which are adjacent to each other. The second light shielding region 32 is provided along each of a boundary between the photoelectric conversion unit 21Ga and the photoelectric conversion unit 21Gb which are adjacent to each other, a boundary between the photoelectric conversion unit 21Gb and the photoelectric conversion unit 21Gd which are adjacent to each other, a boundary between the photoelectric conversion unit 21Gd and the photoelectric conversion unit 21Gc which are adjacent to each other, and a boundary between the photoelectric conversion unit 21Gc and the photoelectric conversion unit 21Ga which are adjacent to each other. The second light shielding region 32 is provided to straddle the photoelectric conversion unit 21Ga and the photoelectric conversion unit 21Gb which are adjacent to each other, to straddle the photoelectric conversion unit 21Gb and the photoelectric conversion unit 21Gd which are adjacent to each other, to straddle the photoelectric conversion unit 21Gd and the photoelectric conversion unit 21Gc which are adjacent to each other, and to straddle the photoelectric conversion unit 21Gc and the photoelectric conversion unit 21Ga which are adjacent to each other.

The blue pixel 2B has a blue sub pixel 20Ba having a photoelectric conversion unit 21Ba among the plurality of photoelectric conversion units 21B, a blue sub pixel 20Bd having a photoelectric conversion unit 21Bd among the plurality of photoelectric conversion units 21B, a blue sub pixel 20Bb having a photoelectric conversion unit 21Bb among the plurality of photoelectric conversion units 21B, and a blue sub pixel 20Bc having a photoelectric conversion unit 21Bc among the plurality of photoelectric conversion units 21B. Hereinafter, in a case where the blue sub pixel 20Ba, the blue sub pixel 20Bb, the blue sub pixel 20Bc, and the blue sub pixel 20Bd are described without distinction, they are collectively referred to as a "blue sub pixel 20B". Further, in a case where the photoelectric conversion unit 21Ba, the photoelectric conversion unit 21Bb, the photoelectric conversion unit 21Bc, and the photoelectric conversion unit 21Bd are described without distinction, they are collectively referred to as a "photoelectric conversion unit 21B".

The blue pixel 2B has a second light shielding region 32 provided between the blue sub pixel 20Ba and the photoelectric conversion unit 21Bb. The blue pixel 2B has a second light shielding region 32 provided between the blue sub pixel 20Ba and the photoelectric conversion unit 21Bc. The blue pixel 2B has a second light shielding region 32 provided between the blue sub pixel 20Bd and the photoelectric conversion unit 21Bb. The blue pixel 2B has a second light shielding region 32 provided between the blue sub pixel 20Bd and the photoelectric conversion unit 21Bc. A width of the second light shielding region 32 provided in the blue pixel 2B is narrower than a width of the first light shielding region 31.

The second light shielding region 32 provided in the blue pixel is provided between the blue filter 22B and each of the photoelectric conversion unit 21Ba and the photoelectric conversion unit 21Bb which are adjacent to each other, the photoelectric conversion unit 21Bb and the photoelectric conversion unit 21Bd which are adjacent to each other, the photoelectric conversion unit 21Bd and the photoelectric conversion unit 21Bc which are adjacent to each other, and the photoelectric conversion unit 21Bc and the photoelectric conversion unit 21Ba which are adjacent to each other. The second light shielding region 32 is provided along each of a boundary between the photoelectric conversion unit 21Ba and the photoelectric conversion unit 21Bb which are adjacent to each other, a boundary between the photoelectric conversion unit 21Bb and the photoelectric conversion unit 21Bd which are adjacent to each other, a boundary between the photoelectric conversion unit 21Bd and the photoelectric conversion unit 21Bc which are adjacent to each other, and a boundary between the photoelectric conversion unit 21Bc and the photoelectric conversion unit 21Ba which are adjacent to each other. The second light shielding region 32 is provided to straddle the photoelectric conversion unit 21Ba and the photoelectric conversion unit 21Bb which are adjacent to each other, to straddle the photoelectric conversion unit 21Bb and the photoelectric conversion unit 21Bd which are adjacent to each other, to straddle the photoelectric conversion unit 21Bd and the photoelectric conversion unit 21Bc which are adjacent to each other, and to straddle the photoelectric conversion unit 21Bc and the photoelectric conversion unit 21Ba which are adjacent to each other.

The red pixel 2R has a red sub pixel 20Ra having a photoelectric conversion unit 21Ra among the plurality of photoelectric conversion units 21R, a red sub pixel 20Rd having a photoelectric conversion unit 21Rd among the plurality of photoelectric conversion units 21R, a red sub pixel 20Rb having a photoelectric conversion unit 21Rb among the plurality of photoelectric conversion units 21R, and a red sub pixel 20Rc having a photoelectric conversion unit 21Rc among the plurality of photoelectric conversion units 21R. Hereinafter, in a case where the red sub pixel 20Ra, the red sub pixel 20Rb, the red sub pixel 20Rc, and the red sub pixel 20Rd are described without distinction, they are collectively referred to as a "red sub pixel 20R". Further, in a case where the photoelectric conversion unit 21Ra, the photoelectric conversion unit 21Rb, the photoelectric conversion unit 21Rc, and the photoelectric conversion unit 21Rd are described without distinction, they are collectively referred to as a "photoelectric conversion unit 21R".

The red pixel 2R has a second light shielding region 32 provided between the red sub pixel 20Ra and the photoelectric conversion unit 21Rb. The red pixel 2R has a second light shielding region 32 provided between the red sub pixel 20Ra and the photoelectric conversion unit 21Rc. The red pixel 2R has a second light shielding region 32 provided between the red sub pixel 20Rd and the photoelectric conversion unit 21Rb. The red pixel 2R has a second light shielding region 32 provided between the red sub pixel 20Rd and the photoelectric conversion unit 21Rc. A width of the second light shielding region 32 provided in the red pixel 2R is narrower than a width of the first light shielding region 31.

The second light shielding region 32 provided in the blue pixel is provided between the blue filter 22B and each of the photoelectric conversion unit 21Ba and the photoelectric conversion unit 21Bb which are adjacent to each other, the photoelectric conversion unit 21Bb and the photoelectric conversion unit 21Bd which are adjacent to each other, the photoelectric conversion unit 21Bd and the photoelectric conversion unit 21Bc which are adjacent to each other, and the photoelectric conversion unit 21Bc and the photoelectric conversion unit 21Ba which are adjacent to each other. The second light shielding region 32 is provided along each of a boundary between the photoelectric conversion unit 21Ba and the photoelectric conversion unit 21Bb which are adjacent to each other, a boundary between the photoelectric conversion unit 21Bb and the photoelectric conversion unit 21Bd which are adjacent to each other, a boundary between the photoelectric conversion unit 21Bd and the photoelectric conversion unit 21Bc which are adjacent to each other, and a boundary between the photoelectric conversion unit 21Bc and the photoelectric conversion unit 21Ba which are adjacent to each other. The second light shielding region 32 is provided to straddle the photoelectric conversion unit 21Ba and the photoelectric conversion unit 21Bb which are adjacent to each other, to straddle the photoelectric conversion unit 21Bb and the photoelectric conversion unit 21Bd which are adjacent to each other, to straddle the photoelectric conversion unit 21Bd and the photoelectric conversion unit 21Bc which are adjacent to each other, and to straddle the photoelectric conversion unit 21Bc and the photoelectric conversion unit 21Ba which are adjacent to each other.

The second light shielding region 32 is arranged in a cross shape in each of the red pixel 2R, the green pixels 2G, and the blue pixel 2B. When viewed in a direction orthogonal to the red pixel 2R, four red sub pixels 20R are partitioned from each other by the second light shielding region 32. Similarly, when viewed in a direction orthogonal to the green pixel 2G, four green sub pixels 20G are arranged to be partitioned from each other by the second light shielding region 32. Similarly, when viewed in a direction orthogonal to the blue pixel 2B, four blue sub pixels 20B are arranged to be partitioned from each other by the second light shielding region 32

The first light shielding region 31 and the second light shielding region 32 are formed integrally, for example. As a result, in each of the red pixel 2R, the green pixel 2G, and the blue pixel 2B, a light shielding region in a grid shape is arranged by the first light shielding region 31 and the second light shielding region 32. The first light shielding region 31 and the second light shielding region 32 are formed in a grid shape to open each of four photoelectric conversion units 21R, four photoelectric conversion units 21G, and four photoelectric conversion units 21B. The first light shielding region 31 and the second light shielding region 32 may be formed of a material that shields light. As a material for forming the first light shielding region 31 and the second light shielding region 32, for example, tungsten (W), aluminum (Al) or copper (Cu) can be used.

As shown in FIG. 3, the solid-state imaging device 1a has a substrate 12 having a plurality of pixels 2, a wiring layer 13 formed on a front surface side of the substrate 12, and a support substrate 11. Further, the solid-state imaging device 1a has a pixel separating part 26 formed to surround a part of the periphery of the photoelectric conversion units 21R, 21G, and 21B. Further, the solid-state imaging device 1a includes an insulating film 24 formed to cover the pixel separating part 26 and the photoelectric conversion units 21R, 21G, and 21B and a flattening film 25 formed to cover the insulating film 24, the first light shielding region 31, and the second light shielding region 32 on a back surface side (that is, a light incidence side) of the substrate 12. The red filter 22R, the green filter 22G, and the blue filter 22B provided in the solid-state imaging device 1a are arranged on a back surface side (that is, a light incidence side) of the flattening film 25. The on-chip lenses 23R, 23G, and 23B provided in the solid-state imaging device 1a are arranged to correspond to each of the red sub pixel 20R, the green sub pixel 20G, and the blue sub pixel 20B on a back surface side (that is, a light incidence side) of the red filter 22R, the green filter 22G, and the blue filter 22B.

The substrate 12 is made of a semiconductor substrate formed of silicon and has a thickness of, for example, 1 μm to 6 μm. In the pixel region 3 (see FIG. 1) provided in the substrate 12, a plurality of pixels 2 each having the photoelectric conversion units 21R, 21G, and 21B and a plurality of pixel transistors (details will be described later) constituting a pixel circuit unit are formed in a two-dimensional matrix shape. The photoelectric conversion units 21R, 21G, and 21B which are adjacent to each other are electrically separated from each other with the insulating film 24 and the pixel separating part 26. Further, although not shown in FIG. 3, a peripheral circuit unit is formed in the peripheral region of the pixel region formed in the substrate 12.

The photoelectric conversion units 21R, 21G, and 21B have the same configuration. Therefore, the configuration of the photoelectric conversion units 21R, 21G, and 21B will be described by taking the photoelectric conversion unit 21G as an example. Further, in FIG. 3, reference signs are not shown for constituent elements constituting the photoelectric conversion unit 21B.

As shown in FIG. 3, the photoelectric conversion unit 21G has p-type semiconductor regions 212 and 213 formed on the front surface side and the back surface side of the substrate 12 and an n-type semiconductor region 211 formed between the p-type semiconductor region 212 and the p-type semiconductor region 213. In the photoelectric conversion unit 21G, a main part of the photodiode is formed with a pn junction between the p-type semiconductor regions 212 and 213 and the n-type semiconductor region 211. The photoelectric conversion unit 21G generates signal charges according to the amount of incident light and stores the generated signal charges in the n-type semiconductor region 211. Further, electrons that cause a dark current generated at an interface of the substrate 12 are absorbed by holes that are a large number of carriers of the p-type semiconductor regions 212 and 213 formed on the front surface and the back surface of the substrate 12. As a result, the dark current generated in the photoelectric conversion unit 21G is suppressed. Further, the photoelectric conversion unit 21R, the photoelectric conversion unit 21G, and the photoelectric conversion unit 21B are electrically separated from each other by the pixel separating parts 26 formed as the p-type semiconductor region to cover the periphery of the n-type semiconductor region 211 and the insulating film 24 arranged between the pixel separating parts 26.

As shown in FIG. 3, the green pixel 2G has a floating diffusion (hereinafter simply referred to as "FD" in some cases) part 30G (see FIG. 2) formed in a central portion between the four photoelectric conversion units 21Ga, 21Gb, 21Gc, and 21Gd arranged in 2 rows and 2 columns. The FD part 30G is formed as an n-type semiconductor region formed by ion-implanting n-type impurities at a high concentration into a p-well layer 29 formed on the front surface side of the substrate 12. The FD part 30G is arranged to overlap an intersection portion of the second light shielding region 32 provided in the green pixel 2G when viewed in a direction orthogonal to the green filter 22G. The FD part 30G is arranged inside the intersection portion of the second light shielding region 32 when viewed in a direction orthogonal to the green filter 22G. As a result, it difficult for light entering from a side of the on-chip lens 23G to enter the FD part 30G.

The blue pixel 2B has an FD part 30B (see FIG. 2) formed in a central portion between the four photoelectric conversion units 21Ba, 21Bb, 21Bc, and 21Bd arranged in 2 rows and 2 columns. Similarly, the red pixel 2R has an FD part 30R (see FIG. 2) formed in a central portion between the four photoelectric conversion units 21Ra, 21Rb, 21Rc, and 21Rd arranged in 2 rows and 2 columns. The FD part 30R and the FD part 30B have the same configuration as the FD part 30G.

As shown in FIG. 2, the pixel transistors include four types of transistors of four transfer transistors, one reset transistor, one amplification transistor, and one selection transistor (seven in total).

Transfer transistors GTr11, GTr12, GTr13, and GTr14 provided in the green pixel 2G are arranged in a central portion of the green pixel 2G when viewed in a direction orthogonal to the green filter 22G. That is, the transfer transistors GTr11, GTr12, GTr13, and GTr14 are arranged in corner portions at which the photoelectric conversion units 21Ga, 21Gb, 21Gc, and 21Gd are adjacent to each other when viewed in the above-described direction. The transfer transistor GTr11 is arranged in the green sub pixel 20Ga, the transfer transistor GTr12 is arranged in the green sub pixel 20Gb, the transfer transistor GTr13 is arranged in the green sub pixel 20Gc, and the transfer transistor GTr14 is arranged in the green sub pixel 20Gd. The transfer transistors GTr11, GTr12, GTr13, and GTr14 provided in the green pixel 2G have the FD part 30G formed in the central portion between the photoelectric conversion units 21G, a gate electrode GE, and a gate insulating film 17 formed on the front surface side of the substrate 12 (see FIG. 3, a gate insulating film 17 of each of the transfer transistors GTr11 and GTr12 is not shown).

As shown in FIG. 2, among pixel transistors of the green pixel 2G, a reset transistor GTr2, an amplification transistor GTr3, and a selection transistor GTr4 are shared between the four photoelectric conversion units 21G that share the FD part 30G with each other. The reset transistor GTr2, the amplification transistor GTr3, and the selection transistor GTr4 of the green pixel 2G arranged to be sandwiched between the red pixels 2R in a direction in which the selection signal lines 9b are lined up are arranged between one of the red pixels 2R on both sides and the green pixel 2G. Further, the reset transistor GTr2, the amplification transistor GTr3, and the selection transistor GTr4 of the green pixel 2G arranged to be sandwiched between the blue pixels 2B in a direction in which the selection signal lines 9b are lined up are arranged between one of the blue pixels 2B on both sides and the green pixel 2G. As a result, the reset transistor GTr2, the amplification transistor GTr3, and the selection transistor GTr4 of the green pixel 2G are arranged to overlap the first light shielding region 31 on a side opposite to the light incidence side when viewed in a direction orthogonal to the green filter 22G.

The reset transistor GTr2 has a source region S, a drain region D, and a gate electrode GE formed between the source region S and the drain region D. The amplification transistor GTr3 has a source region S, a drain region D, and a gate electrode GE formed between the source region S and the drain region D. The selection transistor GTr4 has a source region S, a drain region D, and a gate electrode GE formed between the source region S and the drain region D.

Since the reset transistor GTr2, the amplification transistor GTr3, and the selection transistor GTr4 have the same cross-sectional structure as the transfer transistors GTr11, GTr12, GTr13, and GTr14, the cross-sectional structure thereof is not shown. The source region S and the drain region D of each of the reset transistor GTr2, the amplification transistor GTr3, and the selection transistor GTr4 are formed as an n-type high-concentration impurity region formed in the p-well layer 29 on the front surface of the substrate 12, similarly to the FD part 30G. Further, the gate electrode GE of each of the reset transistor GTr2, the amplification transistor GTr3, and the selection transistor GTr4 is formed on the front surface side of the substrate 12 via the gate insulating film 17.

In the green pixel 2G, the FD part 30G is electrically connected to the source region of each of the transfer transistors GTr11, GTr12, GTr13, and GTr14, the drain region D of the reset transistor GTr2, and the gate electrode GE of the amplification transistor GTr3. Further, the drain region D of the amplification transistor GTr3 and the source region S of the selection transistor GTr4 are shared.

As shown in FIG. 2, the pixel transistors provided in the red pixel 2R include four types of transistor, namely, transfer transistors RTr11, RTr12, RTr13, and RTr14, a reset transistor RTr2, an amplification transistor RTr3, and a selection transistor RTr4 (seven transistors in total). Similarly, the pixel transistors provided in the blue pixel 2B include four types of transistor, namely, transfer transistors BTr11, BTr12, BTr13, and BTr14, a reset transistor BTr2, an amplification transistor BTr3, and a selection transistor BTr4 (seven transistors in total).

The reset transistor RTr2, the amplification transistor RTr3, and a selection transistor RTr4 provided in the red pixel 2R are provided to be shared between the four photoelectric conversion units 21R that share the FD part 30R with each other. The reset transistor RTr2, the amplification transistor RTr3, and the selection transistor RTr4 are alternately arranged with the reset transistor GTr2, the amplification transistor GTr3, and the selection transistor GTr4 provided in the green pixel 2G in a direction in which the selection signal lines 9b are lined up. The reset transistor RTr2, the amplification transistor RTr3, and the selection transistor RTr4 are arranged to overlap the first light shielding region 31 on a side opposite to the light incidence side when viewed in a direction orthogonal to the red filter 22R.

The reset transistor BTr2, the amplification transistor BTr3, and a selection transistor BTr4 provided in the blue pixel 2B are provided to be shared between the four photoelectric conversion units 21B that share the FD part 30B with each other. The reset transistor BTr2, the amplification transistor BTr3, and the selection transistor BTr4 are alternately arranged with the reset transistor GTr2, the amplification transistor GTr3, and the selection transistor GTr4 provided in the green pixel 2G in a direction in which the selection signal lines 9b are lined up. The reset transistor BTr2, the amplification transistor BTr3, and the selection transistor BTr4 are arranged to overlap the first light shielding region 31 on a side opposite to the light incidence side when viewed in a direction orthogonal to the blue filter 22B.

The transfer transistors RTr11, RTr12, RTr13, and RTr14 and the transfer transistors BTr11, BTr12, BTr13, and BTr14 have the same configuration as the transfer transistors GTr11, GTr12, GTr13, and BTr14 and exhibit the same function as them. The reset transistor RTr2 and the reset transistor BTr2 have the same configuration as the reset transistor GTr2 and exhibit the same function as it. The amplification transistor RTr3 and the amplification transistor BTr3 have the same configuration as the amplification transistor GTr3 and exhibit the same function as it. The selection transistor RTr4 and the selection transistor BTr4 have the same configuration as the selection transistor GTr4 and exhibit the same function as it. Therefore, specific description of the configuration of each of the transfer transistors RTr11, RTr12, RTr13, and RTr14, the reset transistor RTr2, the amplification transistor RTr3, the selection transistor RTr4, the transfer transistors BTr11, BTr12, BTr13, and BTr14, the reset transistor BTr2, the amplification transistor BTr3, and the selection transistor BTr4 is omitted.

Returning to FIG. 3, the insulating film 24 is embedded between the pixel separating parts 26 and is formed on the entire surface of the substrate 12 on the back surface side. As a material for forming the insulating film 24, for example, silicon oxide, silicon nitride, silicon oxynitride, a resin, or the like can be used. Further, as a material for forming the insulating film 24, a material with a property of having no positive fixed charges or having a small positive fixed charges can be used.

When the insulating film 24 is embedded between the pixel separating parts 26, the photoelectric conversion units provided in the adjacent pixels 2 are separated from each other via the insulating film 24. As a result, the signal charges are less likely to leak to the adjacent pixel, and thus in a case where the signal charges exceeding a saturation charge amount (Qs) are generated, it is possible to reduce the leakage of the overflowing signal charges to the adjacent photoelectric conversion units. Therefore, the insulating film 24 can suppress electron color mixing.

The flattening film 25 is formed on the entire surface of the insulating film 24 including the first light shielding region 31 and the second light shielding region 32. As a result, the flattening film 25 can flatten the surface of the substrate 12 on the back surface side. As a material for forming the flattening film 25, for example, an organic material such as a resin can be used.

The red filter 22R (not shown in FIG. 3), the green filter 22G, and the blue filter 22B are formed in contact with the back surface side of the flattening film 25 which is a light incidence surface side. The surface of the red filter 22R (not shown in FIG. 3), the green filter 22G, and the blue filter 22B on the light incidence surface side, that is, a side not in contact with the flattening film 25, has a flat shape following the flattening film 25. The red filter 22R is a constituent element that transmits light having a wavelength corresponding to red and absorbs light having a residual wavelength. The green filter 22G is a constituent element that transmits light having a wavelength corresponding to green and absorbs light having a residual wavelength. The blue filter 22B is a constituent element that transmits light having a wavelength corresponding to blue and absorbs light having a residual wavelength.

The red filter 22R is not separated by each of the four red sub pixels 20Ra, 20Rb, 20Rc, and 20Rd and is formed in succession. As a result, the red filter 22R is shared between the four photoelectric conversion units 21Ra, 21Rb, 21Rc, and 21Rd. The light transmitted through the red filter 22R enters any of the photoelectric conversion units 21Ra, 21Rb, 21Rc, and 21Rd provided in the red sub pixels 20Ra, 20Rb, 20Rc, and 20Rd. The green filter 22G is not separated by each of the four green sub pixels 20Ga, 20Gb, 20Gc, and 20Gd and is formed in succession. As a result, the green filter 22G is shared between the four photoelectric conversion units 21Ga, 21Gb, 21Gc, and 21Gd. The light transmitted through the green filter 22G enters any of the photoelectric conversion units 21G provided in the green sub pixels 20Ga, 20Gb, 20Gc, and 20Gd. The blue filter 22B is not separated by each of the four blue sub pixels 20Ba, 20Bb, 20Bc, and 20Bd and is formed in succession. As a result, the blue filter 22B is shared between the four photoelectric conversion units 21Ba, 21Bb, 21Bc, and 21Bd. The light transmitted through the blue filter 22B enters any of the photoelectric conversion units 21Ba, 21Bb, 21Bc, and 21Bd provided in the blue sub pixels 20Ba, 20Bb, 20Bc, and 20Bd.

The on-chip lens 23R is formed on a light incidence surface side of the red filter 22R, the on-chip lens 23G is formed on a light incidence surface side of the green filter 22G, and the on-chip lens 23B is formed on a light incidence surface side of the blue filter 22B. The on-chip lens 23R is formed for each of the red sub pixels 20Ra, 20Rb, 20Rc, and 20Rd, the on-chip lens 23G is formed for each of the green sub pixels 20Ga, 20Gb, 20Gc, and 20Gd, and the on-chip lens 23B is formed for each of the blue sub pixels 20Ba, 20Bb, 20Bc, and 20Bd. Therefore, one red pixel 2R has four on-chip lenses 23R, one green pixel 2G has four on-chip lenses 23G, and one blue pixel 2B has four on-chip lenses 23B. The on-chip lenses 23R, 23G, and 23B can collect light entering from the outside and cause the collected light to efficiently enter the photoelectric conversion unit 21R, 21G, 21B via the red filter 22R, the green filter 22G, and the blue filter 22B.

The wiring layer 13 is formed on the front surface side of the substrate 12 and has a wiring 15 stacked in a plurality of layers (three layers in the present embodiment) via an interlayer insulating film 14. The reset signal and the selection signal output from the vertical drive circuit 4 are input to the reset transistor and the selection transistor among the pixel transistors provided in the pixel 2 via the wiring 15 formed in the wiring layer 13. Further, a power supply for driving the pixel transistors is also input via the wiring 15 formed in the wiring layer 13. As a result, the pixel transistors are driven.

The support substrate 11 is formed on a surface of the wiring layer 13 opposite to a side facing the substrate 12. The support substrate 11 is used to secure a strength of the substrate 12 at a manufacturing stage. The support substrate 11 is made of, for example, a silicon substrate.

In the solid-state imaging device 1a having the above configuration, light is radiated from the back surface side of the substrate 12, and the light transmitted through the on-chip lenses 23R, 23G, and 23B, the red filter 22R, the green filter 22G, and the blue filter 22B is subjected to photoelectric conversion by the photoelectric conversion units 21R, 21G, and 21B to generate signal charges. The signal charges generated by the photoelectric conversion units 21R, 21G, and 21B are output from the vertical signal line 9a formed by the desired wiring 15 of the wiring layer 13 via the pixel transistor formed on the front surface side of the substrate 12 as a pixel signal.

Next, the effect of the solid-state imaging device 1a according to the present embodiment will be described with reference to FIG. 4. In FIG. 4, in order to facilitate understanding, in a case where the second light shielding region 32 overlaps the first light shielding region 31, the first light shielding region 31 is shown with shading in a region where the first light shielding region 31 and the second light shielding region 32 overlap each other and without shading in a region where the first light shielding region 31 and the second light shielding region 32 do not overlap each other. Further, the light entering the solid-state imaging device 1a is refracted at an interface where different constituent elements are in contact with each other, but in FIG. 4, the refraction of light is not shown for the sake of easy understanding.

For example, in a case where the first light shielding region 31 has the same width as the second light shielding region 32, as shown by a broken line arrow in FIG. 4, some of light L1 which is transmitted through the green filter 22G and directs to the first light shielding region 31 is reflected by the first light shielding region 31, and the remainder of the light L1 enters the blue sub pixel 20B arranged next to the green sub pixel 20G having the green filter 22G. The photoelectric conversion unit 21B provided in the blue sub pixel 20B is an element for photoelectric conversion of light corresponding to a wavelength of blue, but light corresponding to a wavelength of green transmitted through the green filter 22G also enters the photoelectric conversion unit 21B. Therefore, color mixing occurs in the blue sub pixel 20B, and image quality of the solid-state imaging device 1a deteriorates.

On the other hand, in the solid-state imaging device 1a according to the present embodiment, as shown in FIG. 4, the light L1 emitted to the solid-state imaging device 1a from the outside is transmitted through the on-chip lens 23G and the green filter 22G and enters the first light shielding region 31. The light L1 entering on the first light shielding region 31 is reflected by the first light shielding region 31 and is absorbed by the blue filter 22B adjacent to the green filter 22G. As described above, the first light shielding region 31 reflects the incident light L1 transmitted through the green filter 22G, and thus it is possible to prevent the light corresponding to a wavelength of green from entering the blue sub pixel 20B arranged next to the green sub pixel 20G having the green filter 22G. As a result, the solid-state imaging device 1a can prevent color mixing and suppress deterioration of image quality.

The second light shielding region 32 has a narrower width than the first light shielding region 31. Therefore, as shown in FIG. 4, for example, some of the light L1 that is transmitted through the blue filter 22B and directs to the second light shielding region 32 is easy to enter the next sub pixel (the blue sub pixel 20B in the present example) as compared with the light L1 directing to the first light shielding region 31. However, since the sub pixel of the same color (the blue sub pixel 20B in the present example) is arranged on a side opposite to a light incidence surface side of the second light shielding region 32, the color mixing does not occur.

The solid-state imaging device 1a can improve sensitivity while preventing the color mixing by making the width of the second light shielding region 32 narrower than the width of the first light shielding region 31. Further, the second light shielding region 32 is arranged to overlap the FD parts 30R, 30G, and 30B.

Incidentally, in a period until the reset transistor is switched from an on-state to an off-state and then the transfer transistor becomes an on-state, electrons which are subjected to the photoelectric conversion in the vicinity of the FD parts 30R, 30G, and 30B and enter the FD parts 30R, 30G, and 30B are detected as a false signal. In particular, a back-illuminated device that aims to detect long-wavelength light such as infrared light may have a light shielding region between sub pixels of the same color in order to suppress the false signal. The solid-state imaging device 1a according to the present embodiment can improve sensitivity while suppressing the photoelectric conversion occurring in the vicinity of the FD parts 30R, 30G, and 30B during the period by making the width of the second light shielding region 32 narrower than the width of the first light shielding region 31.

As described above, the solid-state imaging device 1a according to the present embodiment has the green pixel 2G having the plurality of photoelectric conversion units 21Ga, 21Gb, 21Gc, and 21Gd that share the green filter 22G with each other and the plurality of on-chip lenses 23G. Further, the solid-state imaging device 1a has the blue pixel 2B that is arranged adjacent to the green pixel 2G and has the plurality of photoelectric conversion units 21Ba, 21Bb, 21Bc, and 21Bd that share the blue filter 22B with each other and the plurality of on-chip lenses 23B.

Further, the solid-state imaging device 1a has the red pixel 2R that is arranged adjacent to the green pixel 2G and has the plurality of photoelectric conversion units 21Ra, 21Rb, 21Rc, and 21Rd that share the red filter 22R with each other and the plurality of on-chip lenses 23R. Further, the solid-state imaging device 1a has the first light shielding region 31 provided between the green pixel 2G and each of the blue pixel 2B and the red pixel 2R.

In the solid-state imaging device 1a having the above configuration, it is possible to prevent the color mixing between the pixels 2 having different colors by the first light shielding region 31, and thus it is possible to suppress the deterioration of image quality.

Further, the green pixel 2G has the second light shielding region 32 provided between the green sub pixel 20Ga and the photoelectric conversion unit 21Gb, between the green sub pixel 20Ga and the photoelectric conversion unit 21Gc, between the green sub pixel 20Gd and the photoelectric conversion unit 21Gb, and between the green sub pixel 20Gd and the photoelectric conversion unit 21Gc. The blue pixel 2B has the second light shielding region 32 provided between the blue sub pixel 20Ba and the photoelectric conversion unit 21Bb, between the blue sub pixel 20Ba and the photoelectric conversion unit 21Bc, between the blue sub pixel 20Bd and the photoelectric conversion unit 21Bb, and between the blue sub pixel 20Bd and the photoelectric conversion unit 21Bc. The red pixel 2R has the second light shielding region 32 provided between the red sub pixel 20Ra and the photoelectric conversion unit 21Rb, between the red sub pixel 20Ra and the photoelectric conversion unit 21Rc, between the red sub pixel 20Rd and the photoelectric conversion unit 21Rb, and between the red sub pixel 20Rd and the photoelectric conversion unit 21Rc. The width of the second light shielding region 32 is narrower than the width of the first light shielding region 31.

In the solid-state imaging device 1a having the above configuration, in a period until the reset transistor is switched from an on-state to an off-state and then the transfer transistor becomes an on-state, it is possible to prevent electrons generated by being subjected to the photoelectric conversion in the vicinity of the FD parts 30R, 30G, and 30B from being detected as a false signal in the FD parts 30R, 30G, and 30B, and it is possible to improve the sensitivity.

Second Embodiment

A solid-state imaging device according to a second embodiment of the present disclosure will be described with reference to FIG. 5. A solid-state imaging device 1b according to the present embodiment is characterized in that the green pixel 2G does not have the second light shielding region. In the description of the present embodiment, the constituent elements having the same operations and functions as those of the solid-state imaging device 1a according to the first embodiment are designated by the same reference signs and the description thereof will be omitted.

Since the solid-state imaging device according to the present embodiment has the same overall configuration as the solid-state imaging device 1a according to the first embodiment, the description thereof will be omitted.

Figure 5:
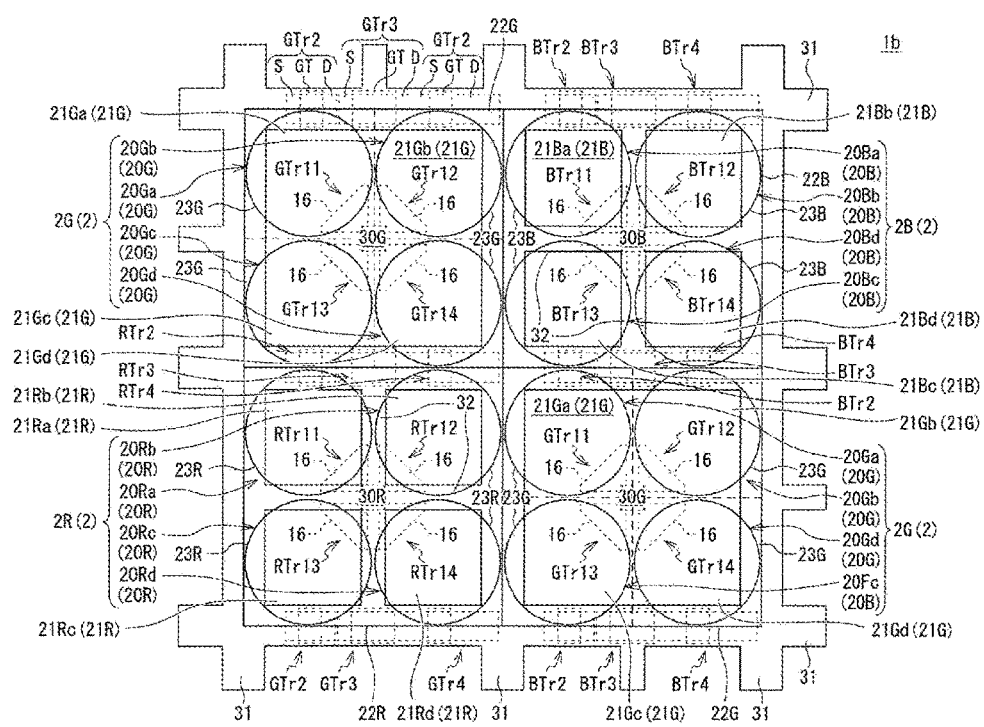
FIG. 5 is a cross-sectional view showing an example of a schematic configuration of pixels provided in a solid-state imaging device according to a second embodiment of the present disclosure.

As shown in FIG. 5, the blue pixel (an example of a first pixel) 2B provided in the solid-state imaging device 1b has the blue sub pixel 20Ba (an example of a first sub pixel) having the photoelectric conversion unit 21Ba (an example of a first photoelectric conversion unit) among the plurality of photoelectric conversion units 21Ba, 21Bb, 21Bc, and 21Bd, the blue sub pixel 20Bd (an example of a first sub pixel) having the photoelectric conversion unit 21Bd (an example of a first photoelectric conversion unit) among the plurality of photoelectric conversion units 21Ba, 21Bb, 21Bc, and 21Bd, the blue sub pixel 20Bb (an example of a second sub pixel) having the photoelectric conversion unit 21Bb (an example of a second photoelectric conversion unit) among the plurality of photoelectric conversion units 21Ba, 21Bb, 21Bc, and 21Bd, and the blue sub pixel 20Bc (an example of a second sub pixel) having the photoelectric conversion unit 21Bc (an example of a second photoelectric conversion unit) among the plurality of photoelectric conversion units 21Ba, 21Bb, 21Bc, and 21Bd. The blue pixel 2B has the second light shielding region 32 between the blue sub pixel 20Ba and the blue sub pixel 20Bd and between the blue sub pixel 20Bb and the blue sub pixel 20Bc.

Similarly, the red pixel (an example of a first pixel) 2R provided in the solid-state imaging device 1b has the red sub pixel 20Ra (an example of a first sub pixel) having the photoelectric conversion unit 21Ra (an example of a first photoelectric conversion unit) among the plurality of photoelectric conversion units 21Ra, 21Rb, 21Rc, and 21Rd, the red sub pixel 20Rd (an example of a first sub pixel) having the photoelectric conversion unit 21Rd (an example of a first photoelectric conversion unit) among the plurality of photoelectric conversion units 21Ra, 21Rb, 21Rc, and 21Rd, the red sub pixel 20Rb (an example of a second sub pixel) having the photoelectric conversion unit 21Rb (an example of a second photoelectric conversion unit) among the plurality of photoelectric conversion units 21Ra, 21Rb, 21Rc, and 21Rd, and the red sub pixel 20Rc (an example of a second sub pixel) having the photoelectric conversion unit 21Rc (an example of a second photoelectric conversion unit) among the plurality of photoelectric conversion units 21Ra, 21Rb, 21Rc, and 21Rd. The red pixel 2R has the second light shielding region 32 between the red sub pixel 20Ra and the red sub pixel 20Rd and between the red sub pixel 20Rb and the red sub pixel 20Rc.

On the other hand, the green pixel (an example of a second pixel) 2G provided in the solid-state imaging device 1b has the green sub pixel 20Ga (an example of a first sub pixel) having the photoelectric conversion unit 21Ga (an example of a first photoelectric conversion unit) among the plurality of photoelectric conversion units 21Ga, 21Gb, 21Gc, and 21Gd, the green sub pixel 20Gd (an example of a first sub pixel) having the photoelectric conversion unit 21Gd (an example of a first photoelectric conversion unit) among the plurality of photoelectric conversion units 21Ga, 21Gb, 21Gc, and 21Gd, the green sub pixel 20Gb (an example of a second sub pixel) having the photoelectric conversion unit 21Gb (an example of a second photoelectric conversion unit) among the plurality of photoelectric conversion units 21Ga, 21Gb, 21Gc, and 21Gd, and the green sub pixel 20Gc (an example of a second sub pixel) having the photoelectric conversion unit 21Gc (an example of a second photoelectric conversion unit) among the plurality of photoelectric conversion units 21Ga, 21Gb, 21Gc, and 21Gd. The green pixel 2G does not have a light shielding region between the green sub pixel 20Ga and the green sub pixel 20Gd and between the green sub pixel 20Gb and the green sub pixel 20Gc.

The red filter 22R of the red pixel 2R (an example of a first color filter) and the blue filter 22B of the blue pixel 2B (an example of a first color filter) have a lower visual sensitivity than the green filter 22G of the green pixel 2G (an example of a second color filter). Therefore, in a case where a first color filter (corresponding to the red filter 22R and the blue filter 22B in the present embodiment) has a lower visual sensitivity than a second color filter (corresponding to the green filter 22G in the present embodiment), the second light shielding region 32 is provided in a first pixel (corresponding to the red pixel 2R and the blue pixel 2B in the present embodiment).

As described above, a light shielding region is not provided in the green pixel 2G that has the green filter 22G having the highest visual sensitivity among the red filter 22R, the green filter 22G, and the blue filter 22B, and thus the amount of the light reflected by the green pixel 2G decreases. As a result, the solid-state imaging device 1b can improve the sensitivity. On the other hand, in the solid-state imaging device 1b, the second light shielding region 32 is not provided in the green pixel 2G, and thus a possibility that a false signal based on the photoelectric conversion in the vicinity of FD part 30G is detected in the green pixel 2G is high as compared with in the solid-state imaging device 1a according to the first embodiment. However, the shorter the wavelength of the light entering the solid-state imaging device 1b is, the more difficult it is for the light to reach the vicinity of the FD part, and thus the false signal is difficult to be detected in the green pixel 2G, and there is almost no problem.

As described above, the solid-state imaging device 1b according to the present embodiment includes the red pixel 2R having the red filter 22R and the photoelectric conversion unit 21R, the green pixel 2G having the green filter 22G and the photoelectric conversion unit 21G, the blue pixel 2B having the blue filter 22B and the photoelectric conversion unit 21B, and the first light shielding region 31 provided between the green pixel 2G and the blue pixel 2B, and the green pixel 2G and the green pixel 2G.

In the solid-state imaging device 1b having the above configuration, it is possible to prevent the color mixing between the pixels 2 having different colors by the first light shielding region 31, and thus it is possible to suppress the deterioration of image quality.

Further, in the solid-state imaging device 1b, the second light shielding region 32 is provided in the red pixel 2R and the blue pixel 2B which have a color filter of a color having a lower visual sensitivity among the red pixel 2R, the green pixel 2G, and the blue pixel 2B. In other words, the green pixel 2G that has the green filter 22G having a higher visual sensitivity is not provided with the second light shielding region. As a result, in the solid-state imaging device 1b, it is possible to decrease the amount of the light reflected by the green pixel 2G that has the green filter 22G having the highest visual sensitivity among the red filter 22R, the green filter 22G, and the blue filter 22B, and thus it is possible to improve the sensitivity.

Third Embodiment

A solid-state imaging device according to a third embodiment of the present disclosure will be described with reference to FIG. 6. A solid-state imaging device 1c according to the present embodiment is characterized in that the green pixel 2G and the blue pixel 2B do not have the second light shielding region. In the description of the present embodiment, the constituent elements having the same operations and functions as those of the solid-state imaging device 1a according to the first embodiment are designated by the same reference signs and the description thereof will be omitted.

Since the solid-state imaging device according to the present embodiment has the same overall configuration as the solid-state imaging device 1a according to the first embodiment, the description thereof will be omitted.

Figure 6:
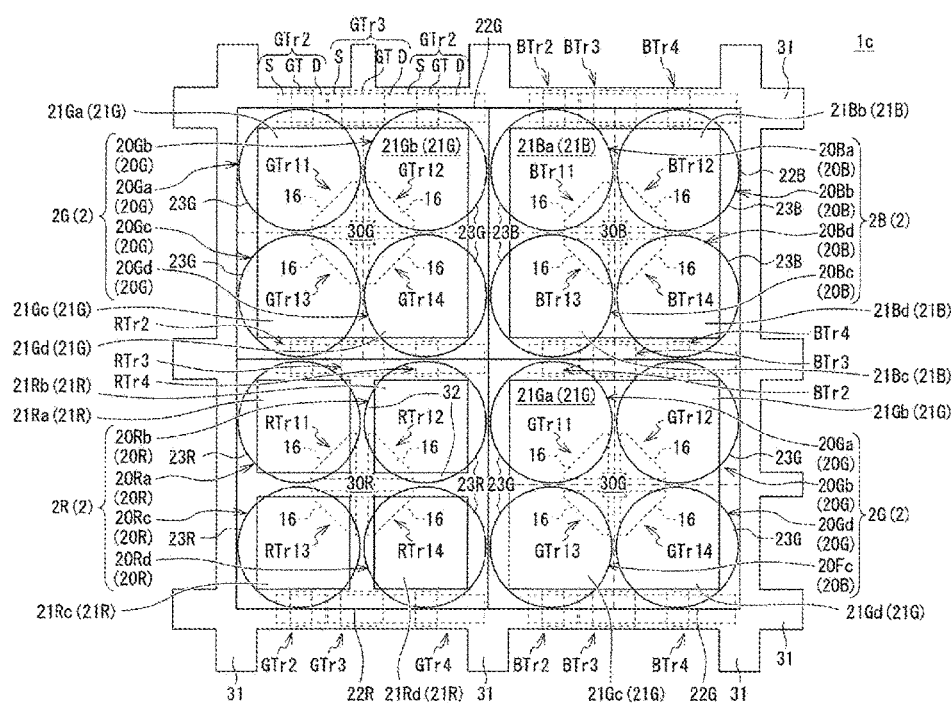
FIG. 6 is a cross-sectional view showing an example of a schematic configuration of pixels provided in a solid-state imaging device according to a third embodiment of the present disclosure.

As shown FIG. 6, in the solid-state imaging device 1c, the red pixel (an example of a first pixel) 2R provided in the solid-state imaging device 1b has the red sub pixel 20Ra (an example of a first sub pixel) having the photoelectric conversion unit 21Ra (an example of a first photoelectric conversion unit) among the plurality of photoelectric conversion units 21Ra, 21Rb, 21Rc, and 21Rd, the red sub pixel 20Rd (an example of a first sub pixel) having the photoelectric conversion unit 21Rd (an example of a first photoelectric conversion unit) among the plurality of photoelectric conversion units 21Ra, 21Rb, 21Rc, and 21Rd, the red sub pixel 20Rb (an example of a second sub pixel) having the photoelectric conversion unit 21Rb (an example of a second photoelectric conversion unit) among the plurality of photoelectric conversion units 21Ra, 21Rb, 21Rc, and 21Rd, and the red sub pixel 20Rc (an example of a second sub pixel) having the photoelectric conversion unit 21Rc (an example of a second photoelectric conversion unit) among the plurality of photoelectric conversion units 21Ra, 21Rb, 21Rc, and 21Rd. The red pixel 2R has the second light shielding region 32 between the red sub pixel 20Ra and the red sub pixel 20Rd and between the red sub pixel 20Rb and the red sub pixel 20Rc.

On the other hand, the green pixel (an example of a second pixel) 2G provided in the solid-state imaging device 1b has the green sub pixel 20Ga (an example of a first sub pixel) having the photoelectric conversion unit 21Ga (an example of a first photoelectric conversion unit) among the plurality of photoelectric conversion units 21Ga, 21Gb, 21Gc, and 21Gd, the green sub pixel 20Gd (an example of a first sub pixel) having the photoelectric conversion unit 21Gd (an example of a first photoelectric conversion unit) among the plurality of photoelectric conversion units 21Ga, 21Gb, 21Gc, and 21Gd, the green sub pixel 20Gb (an example of a second sub pixel) having the photoelectric conversion unit 21Gb (an example of a second photoelectric conversion unit) among the plurality of photoelectric conversion units 21Ga, 21Gb, 21Gc, and 21Gd, and the green sub pixel 20Gc (an example of a second sub pixel) having the photoelectric conversion unit 21Gc (an example of a second photoelectric conversion unit) among the plurality of photoelectric conversion units 21Ga, 21Gb, 21Gc, and 21Gd. The green pixel 2G does not have a light shielding region between the green sub pixel 20Ga and the green sub pixel 20Gd and between the green sub pixel 20Gb and the green sub pixel 20Gc.

Similarly, the blue pixel (an example of a second pixel) 2B provided in the solid-state imaging device 1b has the blue sub pixel 20Ba (an example of a first sub pixel) having the photoelectric conversion unit 21Ba (an example of a first photoelectric conversion unit) among the plurality of photoelectric conversion units 21Ba, 21Bb, 21Bc, and 21Bd, the blue sub pixel 20Bd (an example of a first sub pixel) having the photoelectric conversion unit 21Bd (an example of a first photoelectric conversion unit) among the plurality of photoelectric conversion units 21Ba, 21Bb, 21Bc, and 21Bd, the blue sub pixel 20Bb (an example of a second sub pixel) having the photoelectric conversion unit 21Bb (an example of a second photoelectric conversion unit) among the plurality of photoelectric conversion units 21Ba, 21Bb, 21Bc, and 21Bd, and the blue sub pixel 20Bc (an example of a second sub pixel) having the photoelectric conversion unit 21Bc (an example of a second photoelectric conversion unit) among the plurality of photoelectric conversion units 21Ba, 21Bb, 21Bc, and 21Bd. The blue pixel 2B does not have a light shielding region between the blue sub pixel 20Ba and the blue sub pixel 20Bd and between the blue sub pixel 20Bb and the blue sub pixel 20Bc.

Therefore, the red filter 22R of the red pixel 2R (an example of a first color filter) is a color filter that has a color having a longer wavelength than the green filter 22G of the green pixel 2G (an example of a second color filter) and the blue filter 22B of the blue pixel 2B (an example of a first color filter). Therefore, in a case where a first color filter (corresponding to the red filter 22R in the present embodiment) is a color filter that has a color having a longer wavelength than a second color filter (corresponding to the green filter 22G and the blue filter 22B in the present embodiment), the second light shielding region 32 is provided in a first pixel (corresponding to the red pixel 2R in the present embodiment).

As described above, a light shielding region is not provided in the green pixel 2G and the blue pixel 2B other than the red pixel 2R having the red filter 22R that has a color having a longer wavelength among the red filter 22R, the green filter 22G, and the blue filter 22B, and thus the amount of the light reflected by the green pixel 2G and the blue pixel 2B decreases. As a result, the solid-state imaging device 1c can improve the sensitivity. Further, the solid-state imaging device 1c can improve the sensitivity as compared with the solid-state imaging device 1a according to the first embodiment and the solid-state imaging device 1b according to the second embodiment.

On the other hand, in the solid-state imaging device 1c, the light shielding region is not provided in the green pixel 2G and the blue pixel 2B, and thus a possibility that a false signal based on the photoelectric conversion in the vicinity of FD parts 30G and 30B is detected in the green pixel 2G and the blue pixel 2B is high as compared with in the solid-state imaging device 1a according to the first embodiment and the solid-state imaging device 1b according to the second embodiment. However, the shorter the wavelength of the light entering the solid-state imaging device 1c is, the more difficult for the light is to reach the vicinity of the FD part. Since the solid-state imaging device 1c has the second light shielding region 32 in the red pixel 2R that has the red filter 22R that has a color having the longest wavelength, it is possible to prevent the false signal from being detected in the red pixel 2R. Further, in the green pixel 2G and the blue pixel 2B, the light shielding region is not provided, but, as compared with in the red pixel 2R, the light entering the solid-state imaging device 1c does not reach the vicinity of the FD parts 30G and 30B, and the false signal is difficult to be detected, and thus there is almost no problem.

As described above, the solid-state imaging device 1c according to the present embodiment includes the red pixel 2R having the red filter 22R and the photoelectric conversion unit 21R, the green pixel 2G having the green filter 22G and the photoelectric conversion unit 21G, the blue pixel 2B having the blue filter 22B and the photoelectric conversion unit 21B, and the first light shielding region 31 provided between the green pixel 2G and the blue pixel 2B, and the green pixel 2G and the green pixel 2G.

In the solid-state imaging device 1c having the above configuration, it is possible to prevent the color mixing between the pixels 2 having different colors by the first light shielding region 31, and thus it is possible to suppress the deterioration of image quality.

Further, in the solid-state imaging device 1c, the second light shielding region 32 is provided in the red pixel 2R having the red filter 22R which is a color filter that has a color having the longest wavelength among a first pixel (the red sub pixel 20R in the present embodiment) and a second pixel (the green sub pixel 20G and the blue sub pixel 20B in the present embodiment) and is not provided in the remaining green pixel 2G and the blue pixel 2B. As a result, in the solid-state imaging device 1c, it is possible to prevent the false signal based on the photoelectric conversion in the vicinity of the FD part 30R from being detected in the red pixel 2R, and it is possible to decrease the amount of the light reflected by the green pixel 2G and the blue pixel 2B, and thus it is possible to improve the sensitivity.

Fourth Embodiment

A solid-state imaging device according to a fourth embodiment of the present disclosure will be described with reference to FIGS. 7 to 15. A solid-state imaging device 1d according to the present embodiment is characterized in that any of the red pixel 2R, the green pixel 2G, and the blue pixel 2B does not have the light shielding region. In the description of the present embodiment, the constituent elements having the same operations and functions as those of the solid-state imaging device 1a according to the first embodiment are designated by the same reference signs and the description thereof will be omitted.

Since the solid-state imaging device 1d according to the present embodiment has the same overall configuration as the solid-state imaging device 1a according to the first embodiment, the description thereof will be omitted.

Figure 7:
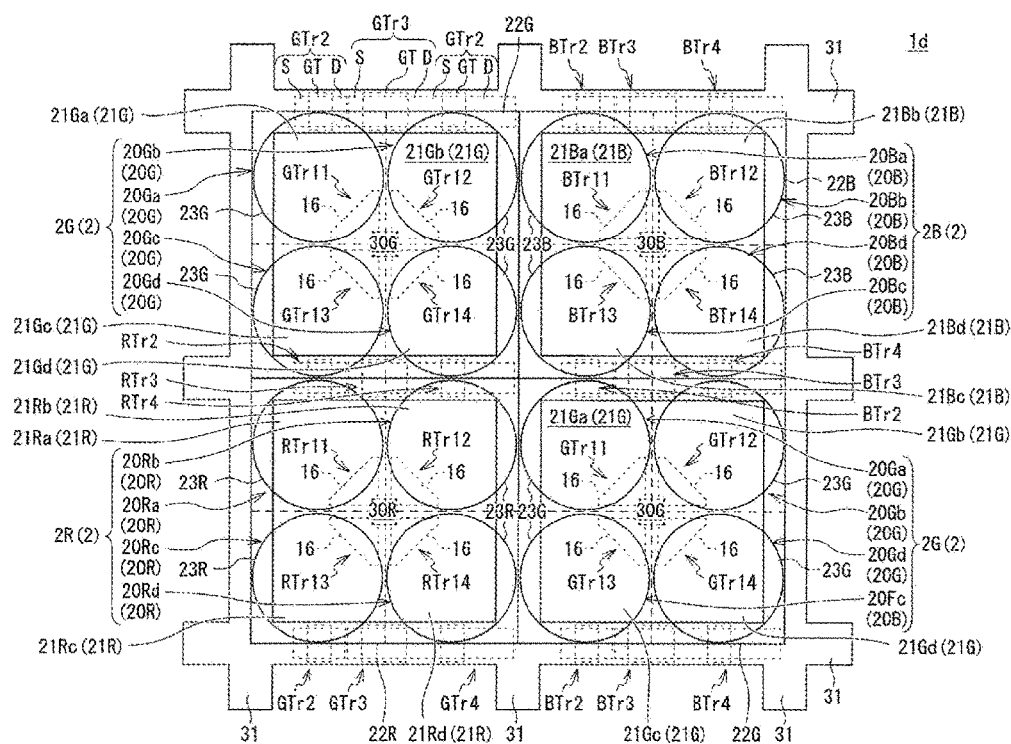
FIG. 7 is a cross-sectional view showing an example of a schematic configuration of pixels provided in a solid-state imaging device according to a fourth embodiment of the present disclosure.

As shown FIG. 7, in the solid-state imaging device 1d according to the present embodiment, any of the red pixel 2R, the green pixel 2G, and the blue pixel 2B does not have the light shielding region.

As a result, in the solid-state imaging device 1d, light is not reflected in an inner region of each of the red pixel 2R, the green pixel 2G, and the blue pixel 2B (that is, a region surrounded by the first light shielding region 31), and thus the amount of light entering the photoelectric conversion units 21R, 21G, and 21B increases as compared with in the solid-state imaging devices 1a, 1b, and 1c according to the first to third embodiments. As a result, the solid-state imaging device 1d can improve the sensitivity as compared with the solid-state imaging devices 1a, 1b, and 1c according to the first to third embodiments.

On the other hand, in the solid-state imaging device 1d, since the FD parts 30R, 30G, and 30B are not shielded from light in the light shielding region, the false signal based on the photoelectric conversion in the vicinity of FD parts 30R, 30G, and 30B is easily detected as compared with in the solid-state imaging devices 1a, 1b, and 1c according to the first to third embodiments. However, in a case where the solid-state imaging device 1d is a sensor that detects infrared rays or has specifications for high-speed analog-to-digital conversion, the detection of the false signal is hardly a problem.

Next, a width of the first light shielding region provided in the solid-state imaging device 1d according to the present embodiment will be described with reference to FIG. 8. The width of the first light shielding region in the present embodiment can be applied to that of the first light shielding region provided in the solid-state imaging devices according to the first to third embodiments and fifth to eighth embodiments which will be described later.

Figure 8:
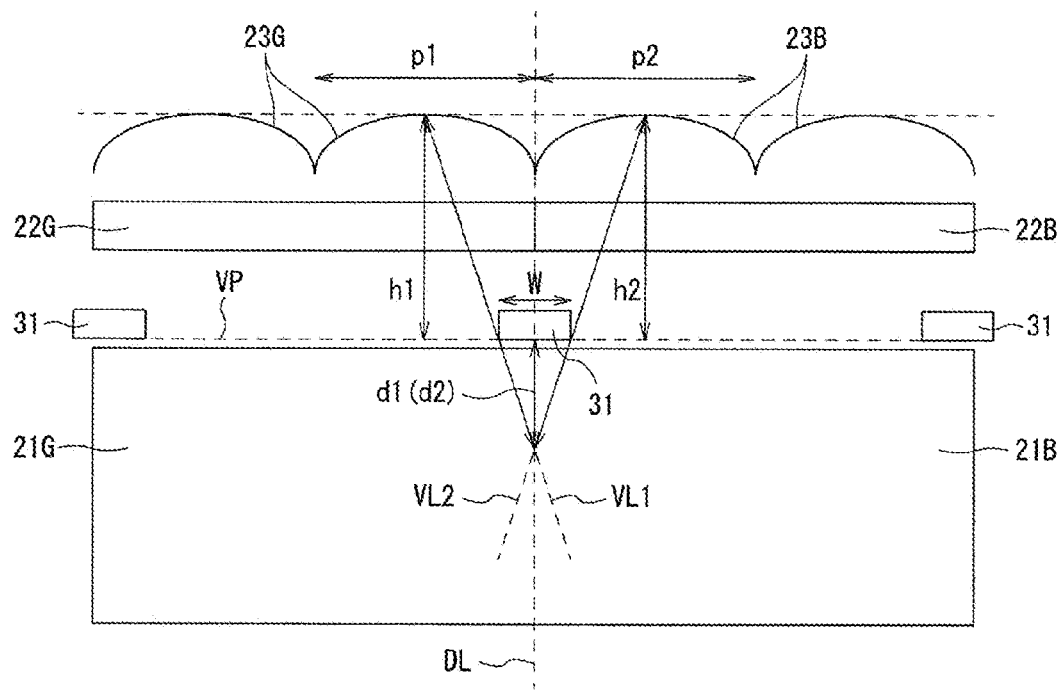
FIG. 8 is a view schematically showing a cross section of a green pixel and a blue pixel provided in the solid-state imaging device according to the fourth embodiment of the present disclosure.

FIG. 8 schematically shows a cross section of the green pixel 2G and the blue pixel 2B.

As shown in FIG. 8, a width of the first light shielding region 31 is defined as w. Further, a pitch between the plurality of on-chip lenses 23G in the green pixel (an example of a first pixel) 2G is defined as p1. Further, a height from a virtual plane VP including a bottom surface 311 of the first light shielding region 31 to a top portion of the on-chip lens 23G closest to the first light shielding region 31 is defined as h1. Further, when an entering length of light into the photoelectric conversion unit 21G is defined as d1, the first light shielding region 31 satisfies the following expression (1). Here, the entering length d1 of light is a distance between an intersection point of a virtual line VL1 passing through the top portion of the on-chip lens 23G closest to the first light shielding region 31 and an apex of the bottom surface 311 on a side of the green pixel 2G and a boundary DL between the green pixel 2G and the blue pixel (an example of a second pixel) 2B and a midpoint of the bottom surface 311 in a cross section orthogonal to an extending direction of the first light shielding region 31 including the top portion. The entering length d1 is a length that causes color mixing in a case where the first light shielding region 31 is not present, but does not cause color mixing in a case where the first light shielding region 31 is present, and is, for example, 0.6 μm.

$$w > 2 \times ((p1/2) \times d1/(h1+d1)) \quad (1)$$

Further, a width of the first light shielding region 31 based on the shapes of the red pixel 2R and the blue pixel 2B (both are examples of a second pixel) can be defined as the same as a width of the first light shielding region 31 based on the shape of the green pixel 2G. Here, the width of the first light shielding region 31 based on the shapes of the red pixel 2R and the blue pixel 2B will be described by taking the blue pixel 2B as an example.

As shown in FIG. 8, a width of the first light shielding region 31 is defined as w. Further, a pitch between the plurality of on-chip lenses 23B in the blue pixel 2B is defined as p2. Further, a height from a virtual plane VP including a bottom surface 311 of the first light shielding region 31 to a top portion of the on-chip lens 23B closest to the first light shielding region 31 is defined as h2. When an entering length of light into the photoelectric conversion unit 21B is defined as d2, the first light shielding region 31 satisfies the following expression (2). The entering length d2 of light is a distance between an intersection point of a virtual line VL2 passing through the top portion of the on-chip lens 23B closest to the first light shielding region 31 and an apex of the bottom surface 311 on a side of the blue pixel 2B and a boundary DL between the green pixel 2G and the blue pixel (an example of a second pixel) 2B and a midpoint of the bottom surface 311 in a cross section orthogonal to an extending direction of the first light shielding region 31 including the top portion. The entering length d2 is a length that causes color mixing in a case where the first light shielding region 31 is not present, but does not cause color mixing in a case where the first light shielding region 31 is present, and is, for example, 0.6 μm.

$$w > 2 \times ((p2/2) \times d2/(h2+d2)) \quad (2)$$

The red pixel 2R, the green pixel 2G, and the blue pixel 2B provided in the solid-state imaging device 1d are formed in the same shape. Therefore, the width of the first light shielding region 31 obtained using the expression (1) and the width of the first light shielding region 31 obtained using the expression (2) are the same. Therefore, the first light shielding region 31 provided in the solid-state imaging device 1d has substantially the same width in the pixel region 3.

Figure 9:
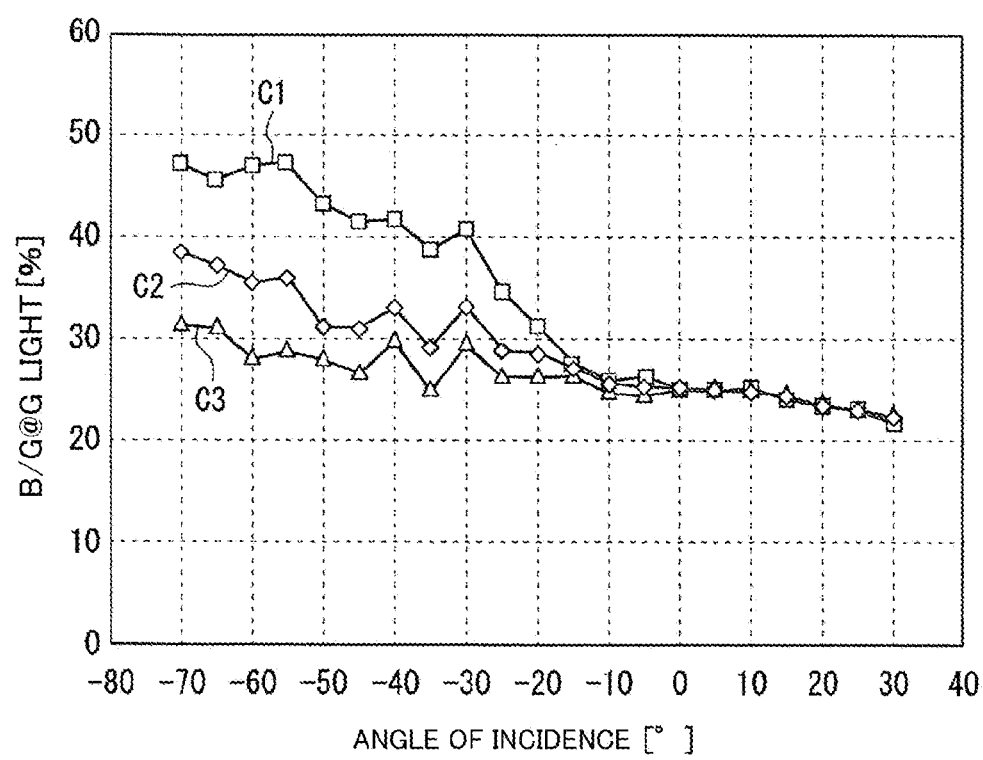
FIG. 9 is a diagram showing the solid-state imaging device according to the fourth embodiment of the present disclosure and is a graph showing a relationship between a line width of optical black and a color mixing resistance of a pixel.

FIG. 9 is a graph showing a relationship between a line width of optical black (OPB) for defining a black level, that is, the width of the first light shielding region, and a color mixing resistance of the pixel. A horizontal axis of the graph in FIG. 9 represents an angle of incidence [°] of the light entering the on-chip lens. A positive angle of incidence indicates incidence from a pupil correction angle, and a negative angle of incidence indicates incidence from a pupil correction inverse angle. "B/G@G light [%]" on a vertical axis of the graph in FIG. 9 represents a rate at which green light entering the green pixel leaks to the blue pixel. A curve C1 connecting square marks shown in FIG. 9 is the color mixing resistance of the pixel of the solid-state imaging device and shows a wave simulation result in a case where the line width of the optical black is 360 nm. A curve C2 connecting diamond marks shown in FIG. 9 is the color mixing resistance of the pixel of the solid-state imaging device and shows a wave simulation result in a case where the line width of the optical black is 560 nm. A curve C3 connecting triangular marks shown in FIG. 9 is the color mixing resistance of the pixel of the solid-state imaging device and shows a wave simulation result in a case where the line width of the optical black is 720 nm.

As shown in FIG. 9, the line width of the optical black is increased, and thus the color mixing resistance of the pixel is improved. Therefore, the color mixing resistance of the pixel of the solid-state imaging device 1d is improved with the increase of the width of the first light shielding region 31. However, when the width of the first light shielding region 31 is increased, the amount of the light reflected by the first light shielding region 31 among the light entering the solid-state imaging device 1d is increased, and thus a problem that the sensitivity of the solid-state imaging device 1d is lowered is caused.

Table 1 shows the sensitivity and the color mixing resistance with respect to a line width and a structure of the optical black. An "OPB line width" in Table 1 indicates a line width of the optical black on a light incidence side. An "OPB structure" shows a shape of the optical black (that is, the light shielding region) when one pixel is viewed in a direction orthogonal to the color filter. "Sensitivity @ center 0°" in Table 1 indicates the sensitivity in a case where light enters the central pixel in the pixel region of the solid-state imaging device at an angle of incidence of 0°. "Color mixing @ H end −30°" in Table 1 indicates the color mixing resistance of the pixel arranged in a most end portion of the pixel region in a longitudinal direction with respect to the incident light from the inverse angle of the pupil correction of 30°. A "grid shape" in an "OPB structure" field indicates a shape formed of a frame shape that surrounds the pixels and a cross shape that extends between opposite sides of the light shielding region. That is, the "grid shape" indicates a shape formed of the first light shielding region and the second light shielding region (here, the widths of both light shielding regions are the same) shown in FIG. 2. A "frame shape" in the "OPB grid shape" field indicates the frame shape that surrounds the pixels.

TABLE 1

| OPB line width | OPB structure | Sensitivity @ center 0° | Color mixing @ H end −30° |
| --- | --- | --- | --- |
| 360 nm | Grid shape | 100% | 40% |
| 560 nm | Grid shape | 90% | 33% |
|  | Frame shape | 95% | 33% |
| 720 nm | Grid shape | 80% | 29% |
|  | Frame shape | 90% | 29% |

As shown in Table 1, the sensitivity in the "sensitivity @ center 0°" in a case where the "OPB line width" is 360 nm is defined as a reference value of 100%. Further, in this case, the color mixing resistance of the pixel is 40%. When the "OPB line width" is 560 nm, the sensitivity in the "sensitivity @ center 0°" is 90% for the "OPB structure" in the grid shape and is 95% for the "OPB structure" in the frame shape. Further, in this case, the color mixing resistance of the pixel is 33% regardless of the OPB structure. When the "OPB line width" is 720 nm, the sensitivity in the "sensitivity @ center 0°" is 80% for the "OPB structure" in the grid shape and is 90% for the "OPB structure" in the frame shape. Further, in this case, the color mixing resistance of the pixel is 29% regardless of the OPB structure.

As described above, when the line width of the OPB is increased, the sensitivity is lowered and the color mixing resistance is improved. Further, the color mixing resistance has the same value for the OPB structure in the grid shape and the frame shape. Therefore, from the viewpoint of suppressing color mixing, the solid-state imaging device does not have a problem even if it does not have the second light shielding region. For example, when the pitch p1 (the pitch p2) of the on-chip lens is 2.2 µm, the height h1 (the height h2) from the virtual plane VP including the bottom surface 311 of the first light shielding region 31 to the top portion of the on-chip lens 23G (the on-chip lens 23B) is 2.2 µm, and the entering length d1 (the entering length d2) is 0.6 µm, a right side of each of the expressions (1) and (2) is 0.47 µm. The width of the first light shielding region in a case where the "OPB line width" shown in Table 1 is 560 nm and the width of the first light shielding region in a case where the "OPB line width" is 720 nm are both longer than 0.47 µm, and the expressions (1) and (2) are satisfied. Therefore, in the solid-state imaging device 1d, the width of the first light shielding region 31 may be changed depending on whether the sensitivity or the color mixing resistance is prioritized.

Figure 10:
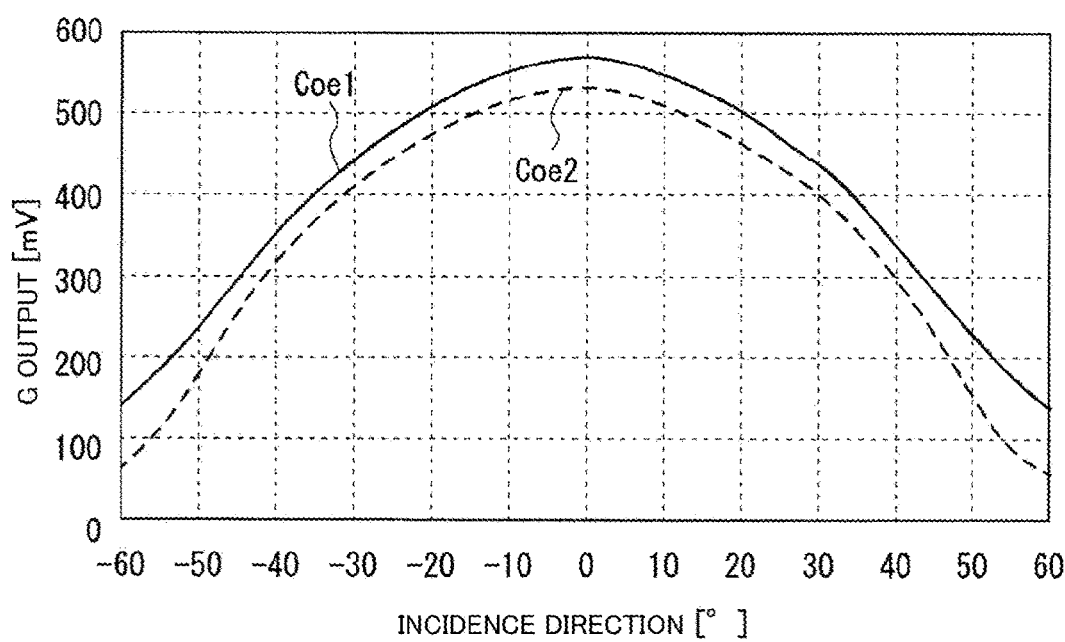
FIG. 10 is a diagram showing the solid-state imaging device according to the fourth embodiment of the present disclosure and is a graph (part 1) of an actual measurement result in which oblique incidence characteristics in a central portion of a pixel region are represented by an image height.
Figure 11:
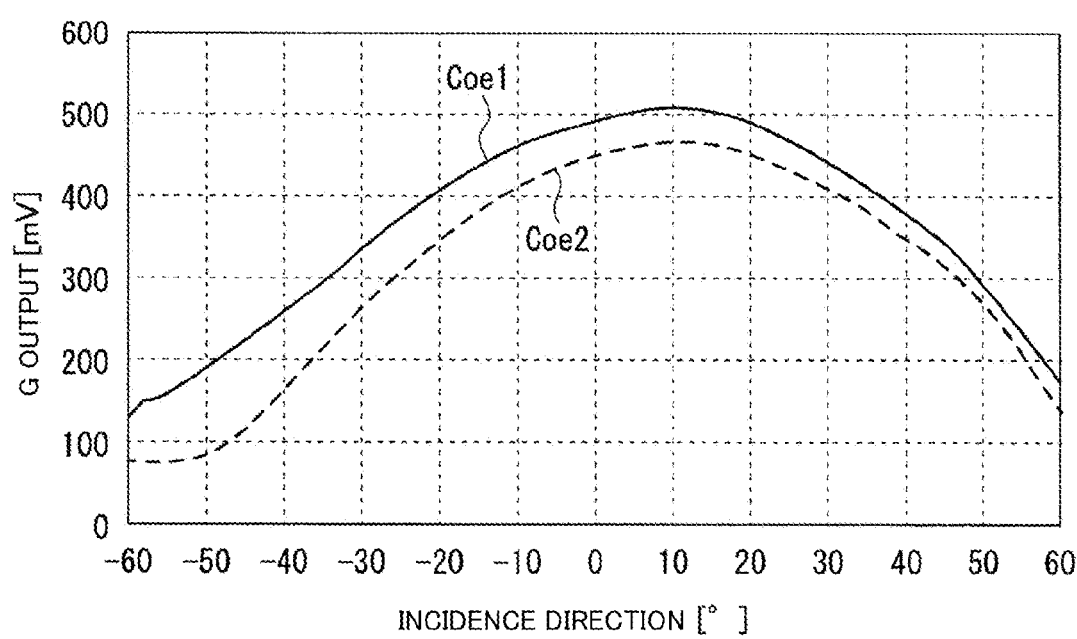
FIG. 11 is a diagram showing the solid-state imaging device according to the fourth embodiment of the present disclosure and is a graph (part 2) of an actual measurement result in which oblique incidence characteristics in a central portion of a pixel region are represented by an image height.
Figure 12:
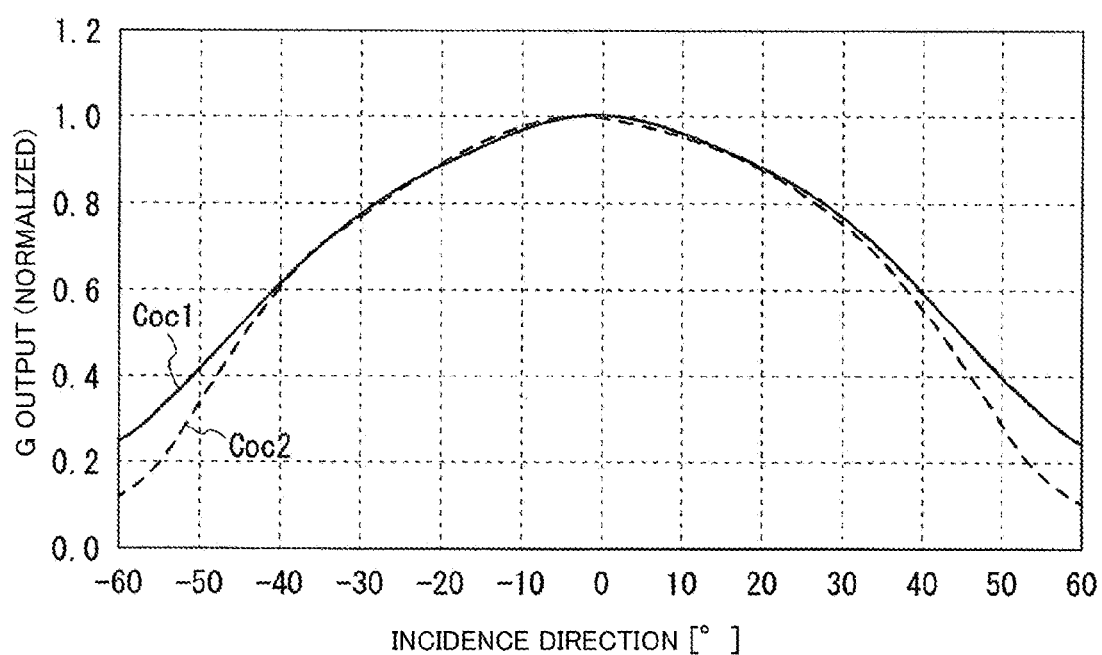
FIG. 12 is a diagram showing the solid-state imaging device according to the fourth embodiment of the present disclosure and is a graph (part 1) of an actual measurement result in which oblique incidence characteristics in an end portion of a pixel region in a longitudinal direction are represented by an image height.
Figure 13:
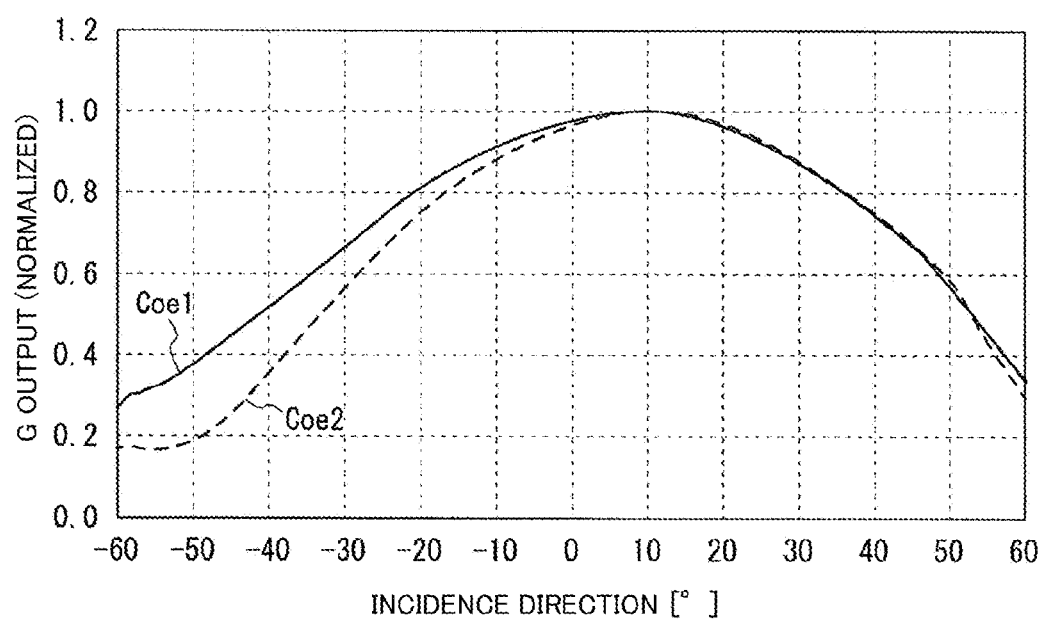
FIG. 13 is a diagram showing the solid-state imaging device according to the fourth embodiment of the present disclosure and is a graph (part 2) of an actual measurement result in which oblique incidence characteristics in an end portion of a pixel region in a longitudinal direction are represented by an image height.

FIGS. 10 and 11 are graphs of an actual measurement result in which oblique incidence characteristics in a central portion of the pixel region of the solid-state imaging device are represented by an image height. FIGS. 12 and 13 are graphs of an actual measurement result in which oblique incidence characteristics in an end portion of the pixel region of the solid-state imaging device in a longitudinal direction are represented by an image height. A horizontal axis of the graphs in FIGS. 10 to 13 represents an incidence direction [°] of the light entering the on-chip lens. A positive value in the incidence direction indicates incidence from one side (for example, a right side) with respect to the center of the pixel region in the longitudinal direction of the pixel region, and a negative value in the incidence direction indicates incidence from the other side (for example, a left side). "G output [mV]" shown on a vertical axis of the graphs in FIGS. 10 and 11 represents an output voltage of green light obtained in a case where white light enters the pixel. "G output (normalized)" shown on a vertical axis of the graphs in FIGS. 12 and 13 represents an output of green light normalized with a value of 0° in the incidence direction which is obtained in a case where white light enters a pixel. Curves Coc1 shown in FIGS. 10 to 13 show oblique incidence characteristics in a case where the structure of the optical black is the frame shape and the line width thereof is 600 nm. Curves Coc2 shown in FIGS. 10 to 13 show oblique incidence characteristics in a case where the structure of the optical black is the grid shape and the line width thereof is 400 nm. The frame shape has the same structure as the "frame shape" shown in the "OPB structure" field in Table 1, and the grid shape has the same structure as the "grid shape" shown in the "OPB structure" field in Table 1.

As shown in FIGS. 10 and 11, the oblique incidence characteristics of the solid-state imaging device are such that the output of green light is higher in the frame shape than in the grid shape in the structure of the optical black at both the central portion and the end portion of the pixel region. As shown in FIG. 12, in a case where the output of green light is normalized with a value of 0° in the incidence direction, the oblique incidence characteristics at the central portion of the pixel region of the solid-state imaging device are such that the output of green light is almost the same in the grid shape and the frame shape in the structure of the optical black in a range of ±30° in the incidence direction and is higher in the frame shape than in the grid shape in the structure of the optical black in a range of −60° to −30° and +30° to +60° in the angle of incidence. As shown in FIG. 13, in a case where the output of green light is normalized with a value of 0° in the incidence direction, the oblique incidence characteristics at the end portion of the pixel region of the solid-state imaging device in the longitudinal direction are such that the output of green light is almost the same in the grid shape and the frame shape in the structure of the optical black in a range of −10° to +60° in the incidence direction and is higher in the frame shape than in the grid shape in the structure of the optical black in a range of −60° to −10° in the angle of incidence.

Figure 14:
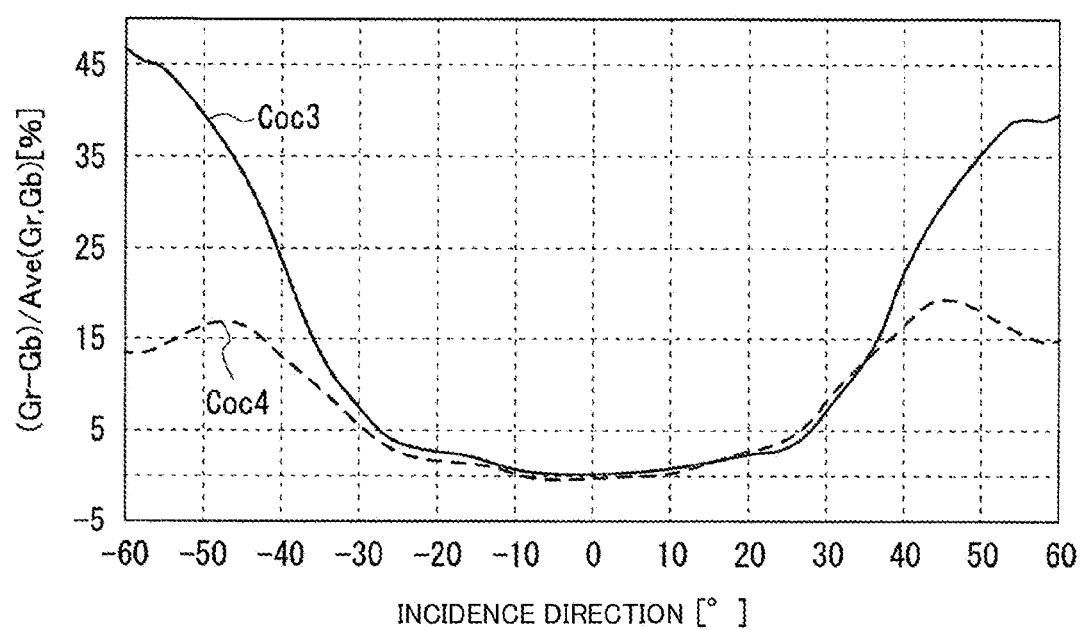
FIG. 14 is a diagram showing the solid-state imaging device according to the fourth embodiment of the present disclosure and is a graph of an actual measurement result in which an LCR in a central portion of a pixel region is represented by an image height.
Figure 15:
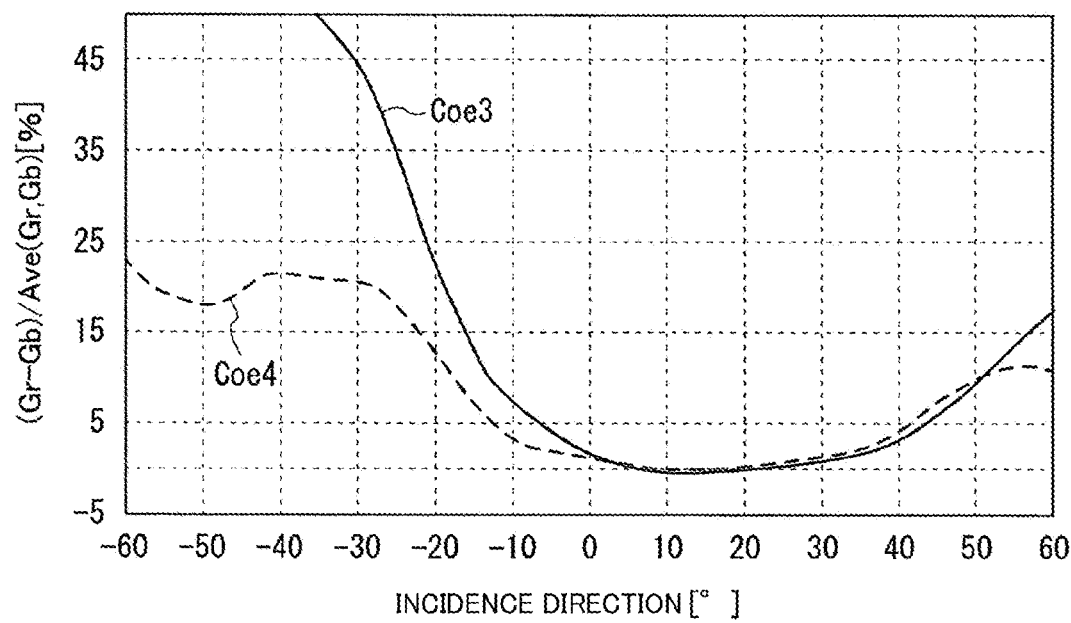
FIG. 15 is a diagram showing the solid-state imaging device according to the fourth embodiment of the present disclosure and is a graph of an actual measurement result in which an LCR in an end portion of a pixel region in a longitudinal direction is represented by an image height.

FIG. 14 is a graph of an actual measurement result in which a line crawl R (LCR) in a central portion of the pixel region of the solid-state imaging device is represented by an image height. The LCR indicates a step between the green pixel and the blue pixel due to color mixing occurring when red light is emitted. FIG. 15 is a graph of an actual measurement result in which the LCR in an end portion of the pixel region of the solid-state imaging device in a longitudinal direction is represented by an image height. A horizontal axis of the graphs in FIGS. 14 and 15 represents an incidence direction [°] of the light entering the on-chip lens. A positive value in the incidence direction indicates incidence from one side (for example, a right side) with respect to the center of the pixel region in the longitudinal direction of the pixel region, and a negative value in the incidence direction indicates incidence from the other side (for example, a left side). "(Gr−Gb)/Ave(Gr, Gb) [%]" shown on the vertical axis of the graphs in FIGS. 14 and 15 represents a step (that is, "LCR") between the green pixel and the blue pixel due to color mixing occurring when red light is emitted. A curves Coc3 shown in FIG. 14 shows LCR characteristics in a case where the structure of the optical black is the frame shape and the line width thereof is 600 nm. A curves Coc4 shown in FIG. 14 shows LCR characteristics in a case where the structure of the optical black is the grid shape and the line width thereof is 400 nm. A curves Coe3 shown in FIG. 15 shows LCR characteristics in a case where the structure of the optical black is the frame shape and the line width thereof is 600 nm. A curves Coe4 shown in FIG. 15 shows LCR characteristics in a case where the structure of the optical black is the grid shape and the line width thereof is 400 nm. The frame shape has the same structure as the "frame shape" shown in the "OPB structure" field in Table 1, and the grid shape has the same structure as the "grid shape" shown in the "OPB structure" field in Table 1.

As shown in FIG. 14, the LCR characteristics at the central portion of the pixel region of the solid-state imaging device are such that the LCR is almost the same in the grid shape and the frame shape in the structure of the optical black in a range of −15° to +35° in the incidence direction and is higher in the frame shape than in the grid shape in the structure of the optical black in a range of −60° to −15° and +35° to +60° in the angle of incidence. As shown in FIG. 15, the LCR characteristics at the end portion of the pixel region of the solid-state imaging device in the longitudinal direction are such that the LCR is almost the same in the grid shape and the frame shape in the structure of the optical black in a range of 0° to 50° in the incidence direction and is higher in the frame shape than in the grid shape in the structure of the optical black in a range of −60° to 0° and +50° to +60° in the angle of incidence.

As described above, even though the solid-state imaging device 1d does not have the second light shielding region, if the width of the first light shielding region 31 is determined on the basis of the relational expressions (that is, an aspect ratio of the pixel 2 in a depth direction) shown in the expressions (1) and (2) and the incidence direction of the incident light is within a predetermined range, it is possible to improve the sensitivity while preventing color mixing.

As described above, the solid-state imaging device 1d according to the present embodiment includes the red pixel 2R having the red filter 22R and the photoelectric conversion unit 21R, the green pixel 2G having the green filter 22G and the photoelectric conversion unit 21G, the blue pixel 2B having the blue filter 22B and the photoelectric conversion unit 21B, and the first light shielding region 31 provided between the green pixel 2G and the blue pixel 2B, and the green pixel 2G and the green pixel 2G.

In the solid-state imaging device 1d having the above configuration, it is possible to prevent the color mixing between the pixels 2 having different colors by the first light shielding region 31, and thus it is possible to suppress the deterioration of image quality.

Further, in the solid-state imaging device 1d, the light shielding region is not provided in the inner regions of the red pixel 2R, the green pixel 2G, and the blue pixel 2B, while the width of the first light shielding region 31 is set to satisfy the above-mentioned expressions (1) and (2). As a result, the solid-state imaging device 1d can improve the sensitivity while preventing color mixing.

Fifth Embodiment

A solid-state imaging device according to a fifth embodiment of the present disclosure will be described with reference to FIGS. 16 and 17. A solid-state imaging device 1e according to the present embodiment is characterized in that it includes an insulating film formed between the red pixel 2R and the green pixel 2G and between the green pixel 2G and the blue pixel 2B. In the description of the present embodiment, the constituent elements having the same operations and functions as those of the solid-state imaging device 1a according to the first embodiment are designated by the same reference signs and the description thereof will be omitted.

Since the solid-state imaging device 1e according to the present embodiment has the same overall configuration as the solid-state imaging device 1a according to the first embodiment, the description thereof will be omitted. Further, the solid-state imaging device 1e can include any of the first light shielding region 31 and the second light shielding region 32 (excluding the solid-state imaging device 1d) provided in the solid-state imaging devices 1a, 1b, 1c, and 1d according to the first to fourth embodiments. In FIGS. 16 and 17, a solid-state imaging device 1e having the first light shielding region 31 and the second light shielding region 32 as in the solid-state imaging device 1a is shown.

Figure 16:
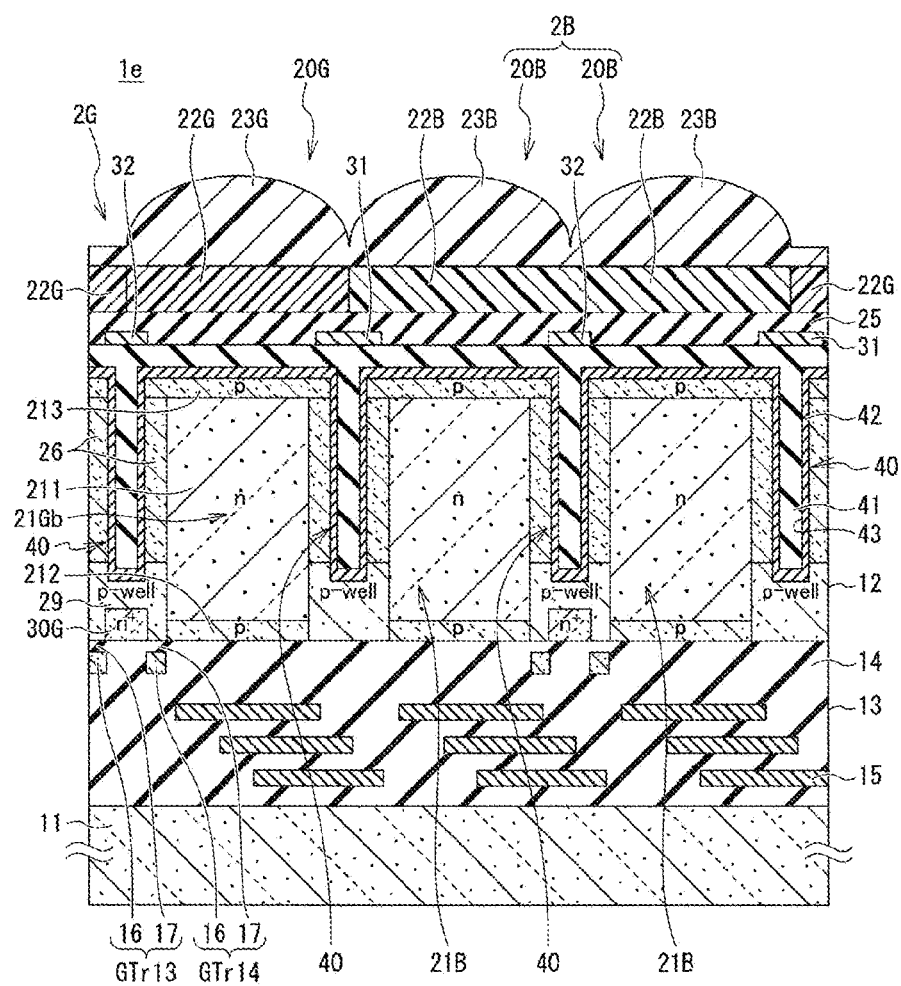
FIG. 16 is a cross-sectional view showing an example of a schematic configuration of pixels provided in a solid-state imaging device according to a fifth embodiment of the present disclosure.

As shown in FIG. 16, the solid-state imaging device 1e includes an insulating film 41 formed to overlap the first light shielding region 31 between the green pixel (an example of a first pixel) 2G and the blue pixel (an example of a second pixel) 2B. Further, although not shown, the insulating film 41 is formed to overlap the first light shielding region 31 even between the green pixel 2G and the red pixel (an example of a second pixel) 2R. Further, the solid-state imaging device 1e has an element separating part 40 including an insulating film 41 formed between the green pixel 2G and the blue pixel 2B and between the green pixel 2G and the red pixel 2R. Hereinafter, the configuration of the element separating part 40 formed between the plurality of pixels 2 and including the insulating film 41 will be described by taking the element separating part 40 formed between the green pixel 2G and the blue pixel 2B as an example.

As shown in FIG. 16, the element separating part 40 has a fixed charge film 42 and the insulating film 41 which are formed by being sequentially embedded in a groove portion 43 formed in the depth direction from the back surface side of the substrate 12. The element separating part 40 is formed by being engraved in the pixel separating part 26 formed in the substrate 12. The element separating part 40 is formed in a grid shape to surround the plurality of pixels 2. The element separating part 40 is arranged below the first light shielding region 31 and the second light shielding region 32 when viewed in a direction orthogonal to a layer in which the red filter 22R, the green filter 22G, and the blue filter 22B are formed. Further, the element separating part 40 is arranged to overlap the FD parts 30R, 30G, and 30B in a portion arranged below the second light shielding region 32.

The element separating part 40 is formed at a depth that reaches the p-well layer 29 in which the pixel transistor is formed but does not reach the FD parts 30R, 30G, and 30B. When a depth of each of the FD parts 30R, 30G, and 30B is less than 1 μm, the element separating part 40 can be formed at a depth of about 0.25 μm to 5.0 μm from the surface of the substrate 12. In the present embodiment, the element separating part 40 is formed at a depth that reaches the p-well layer 29 of the pixel transistor, but it is sufficient for an end portion of the element separating part 40 on the back surface side of the substrate 12 to be formed in contact with a p-type semiconductor layer, and the element separating part 40 does not necessarily have to be deep enough to reach the p-well layer 29. In a case when the element separating part 40 is formed in the pixel separating part 26 made of the p-type semiconductor layer as in the present embodiment, the effect of insulation separation can be obtained even if the element separating part 40 does not reach the p-well layer 29.

Further, the fixed charge film 42 formed in the groove portion 43 is formed on an inner peripheral surface and a bottom surface of the groove portion 43 and is formed on the entire back surface of the substrate 12. Hereinafter, the inner peripheral surface and the bottom surface of the groove portion 43 will be collectively referred to as an "inner wall surface". The fixed charge film 42 may be formed of a material capable of generating fixed charges and strengthening pinning by depositing on a substrate such as silicon, and may use a high refractive index material film or a high dielectric film having negative charges. As a specific material for forming the fixed charge film 42, for example, oxides or nitrides containing at least one element of hafnium (Hf), aluminum (Al), zirconium (Zr), tantalum (Ta), and titanium (Ti) can be applied. Examples of a film forming method for the fixed charge film 42 include a chemical vapor deposition method (hereinafter referred to as a CVD method), a sputtering method, an atomic layer deposition method (hereinafter referred to as an ALD method), and the like. When the ALD method is used to form the fixed charge film 42, it is possible to simultaneously form a SiO2 film which reduces an interface level during the film formation to have a film thickness of about 1 nm. Examples of materials other than the material for forming the fixed charge film 42 include oxides, nitrides, or the like containing at least one element of lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), and yttrium (Y). Further, the fixed charge film 42 can be formed of a hafnium oxynitride film or an aluminum oxynitride film.

Silicon (Si) or nitrogen (N) may be added to the material for forming the fixed charge film 42 in the film as long as an insulating property is not impaired. A concentration of an additive added to the fixed charge film 42 is appropriately determined as long as an insulating property of the film is not impaired. By adding silicon (Si) or nitrogen (N) to the fixed charge film 42, it is possible to increase a heat resistance of the fixed charge film 42 and an ability to prevent ion implantation in a process thereof.

In the present embodiment, the fixed charge film 42 having negative charges is formed on the inner wall surface of the groove portion 43 and the back surface of the substrate 12, and thus an inversion layer is formed on the surface in contact with the fixed charge film 42. As a result, a silicon interface is pinned with the inversion layer, and thus the generation of a dark current is suppressed. Further, in a case where the groove portion 43 is formed in the substrate 12, there is a problem that physical damage occurs on the side wall and the bottom surface of the groove portion 43 and pinning detachment may occur in the peripheral portion of the groove portion 43. To solve this problem, the solid-state imaging device 1e can prevent the pinning detachment with the fixed charge film 42 formed on the side wall and the bottom surface of the groove portion 43 and having large fixed charges.

The insulating film 41 is embedded in the groove portion 43 in which the fixed charge film 42 is formed and is formed on the entire surface of the substrate 12 on the back surface side. The insulating film 41 is preferably made of a material having a refractive index different from that of the fixed charge film 42. Examples of the material for forming the insulating film 41 include silicon oxide, silicon nitride, silicon oxynitride, a resin, or the like. Further, the insulating film 41 may be formed of a material having no positive fixed charges or having small positive fixed charges.

When the groove portion 43 is embedded in the insulating film 41, the photoelectric conversion unit 21R provided in the red sub pixel 20R, the photoelectric conversion unit 21G provided in the green sub pixel 20G, and the photoelectric conversion unit 21B provided in the blue sub pixel 20B are separated from each other via the insulating film 41. As a result, it is difficult for the signal charges to leak to the adjacent sub pixels. Therefore, in a case where the signal charges exceeding a saturation charge amount (Qs) are generated, it is possible for the insulating film 41 to reduce the leakage of the overflowing signal charges to the adjacent photoelectric conversion units 21R, 21G, and 21B. In this way, the insulating film 41 can suppress electron color mixing.

Further, a two-layer structure of the fixed charge film 42 and the insulating film 41 formed on the back surface side which is the incidence surface side of the substrate 12 has a role of an antireflection film due to a difference in the refractive index between the fixed charge film 42 and the insulating film 41. This prevents the light entering from the back surface side of the substrate 12 from being reflected on the back surface side of the substrate 12.

As described above, the solid-state imaging device 1e has a structure (reverse deep trench isolation: RDTI) for digging a trench (that is, the groove portion 43) between the pixels 2 from the back surface side of the substrate 12. Here, the effect of the solid-state imaging device 1e will be described with reference to FIG. 17. The light entering the solid-state imaging device 1e is refracted at a surface of the on-chip lens or an interface where different constituent elements are in contact with each other, but in FIG. 17, the refraction of light is not shown for the sake of easy understanding. Further, in FIG. 17, for the sake of easy understanding, a light shielding region 33 provided in the solid-state imaging device of the related art, which is not originally provided in the solid-state imaging device 1e, is shown instead of a part of the first light shielding region 31.

Figure 17:
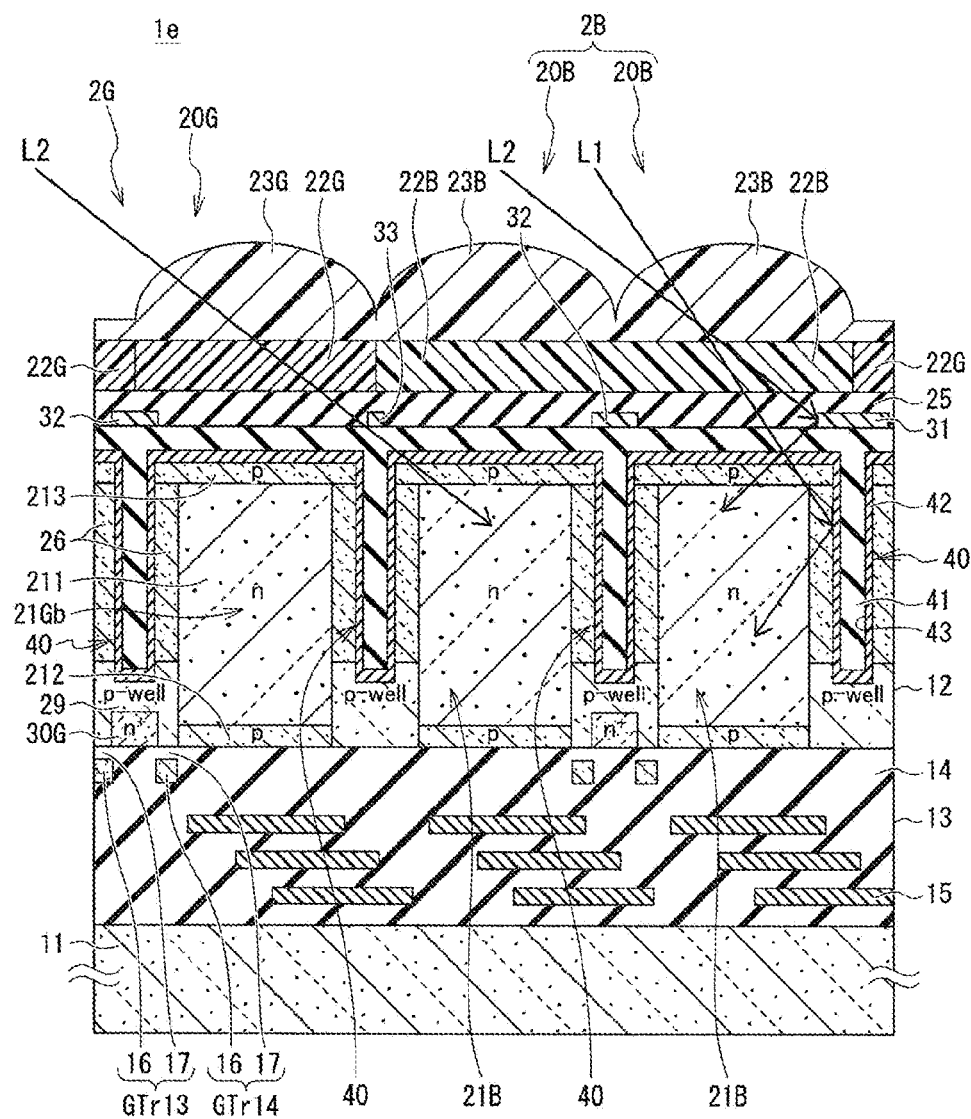
FIG. 17 is a view for showing an effect of the solid-state imaging device according to the fifth embodiment of the present disclosure.

As shown in FIG. 17, in a case where the light L1 having a low angle of incidence enters the photoelectric conversion unit 21B via, for example, the on-chip lens 23B and the blue filter 22B, the light L1 is reflected by the insulating film 41. Therefore, the light L1 entering the photoelectric conversion unit 21B does not enter the photoelectric conversion unit 21G (not shown) of the green sub pixel 20G arranged next to the blue sub pixel 20B having the photoelectric conversion unit 21B. As a result, the solid-state imaging device 1e can prevent color mixing.

Incidentally, the light shielding region 33 of the related art has a narrower width than the first light shielding region 31 and the second light shielding region 32. Therefore, for example, the light L2 entering the light shielding region 33 at a high angle of incidence via the on-chip lens 23G and the green filter 22G passes through the light shielding region 33 and enters the photoelectric conversion unit 21B of the blue sub pixel 20B arranged next to the green sub pixel 20G having the green filter 22G. This causes color mixing in the solid-state imaging device of the related art.

On the other hand, the first light shielding region 31 has a wider width than the light shielding region 33 of the related art. Therefore, for example, the light L2 entering the first light shielding region 31 at a high angle of incidence via the on-chip lens 23B and the blue filter 22B is reflected without passing through the first light shielding region 31. As a result, the light L2 enters the photoelectric conversion unit 21B of the blue sub pixel 20B having the blue filter 22B rather than the green sub pixel 20G (not shown) arranged next to the blue sub pixel 20B having the blue filter 22B. As a result, the solid-state imaging device 1e can prevent color mixing. Further, since the first light shielding region 31 has a wider width than the light shielding region 33 of the related art, an alignment margin with the element separating part 40 including the insulating film 41 becomes large. As a result, the manufacturing yield of the solid-state imaging device 1e can be improved, and the cost of the solid-state imaging device 1e can be reduced.

As described above, the solid-state imaging device 1e according to the present embodiment includes the insulating film 41 formed to overlap the first light shielding region 31 between the green pixel 2G and the blue pixel 2B. The insulating film 41 is formed to overlap the first light shielding region 31 even between the green pixel 2G and the red pixel 2R.

In the solid-state imaging device 1e having the above configuration, it is possible to prevent light from entering the sub pixels having different colors by the insulating film 41 and to prevent the color mixing between the pixels 2, and thus it is possible to suppress the deterioration of image quality.

Sixth Embodiment

A solid-state imaging device according to a sixth embodiment of the present disclosure will be described with reference to FIG. 18. A solid-state imaging device 1f according to the present embodiment is characterized in that it has a large-sized wall structure. In the description of the present embodiment, the constituent elements having the same operations and functions as those of the solid-state imaging device 1a according to the first embodiment are designated by the same reference signs and the description thereof will be omitted.

Since the solid-state imaging device 1e according to the present embodiment has the same overall configuration as the solid-state imaging device 1a according to the first embodiment, the description thereof will be omitted. Further, the solid-state imaging device 1f includes the first light shielding region 31 but does not include the second light shielding region 32 as in the solid-state imaging device 1d according to the fourth embodiment.

Figure 18:
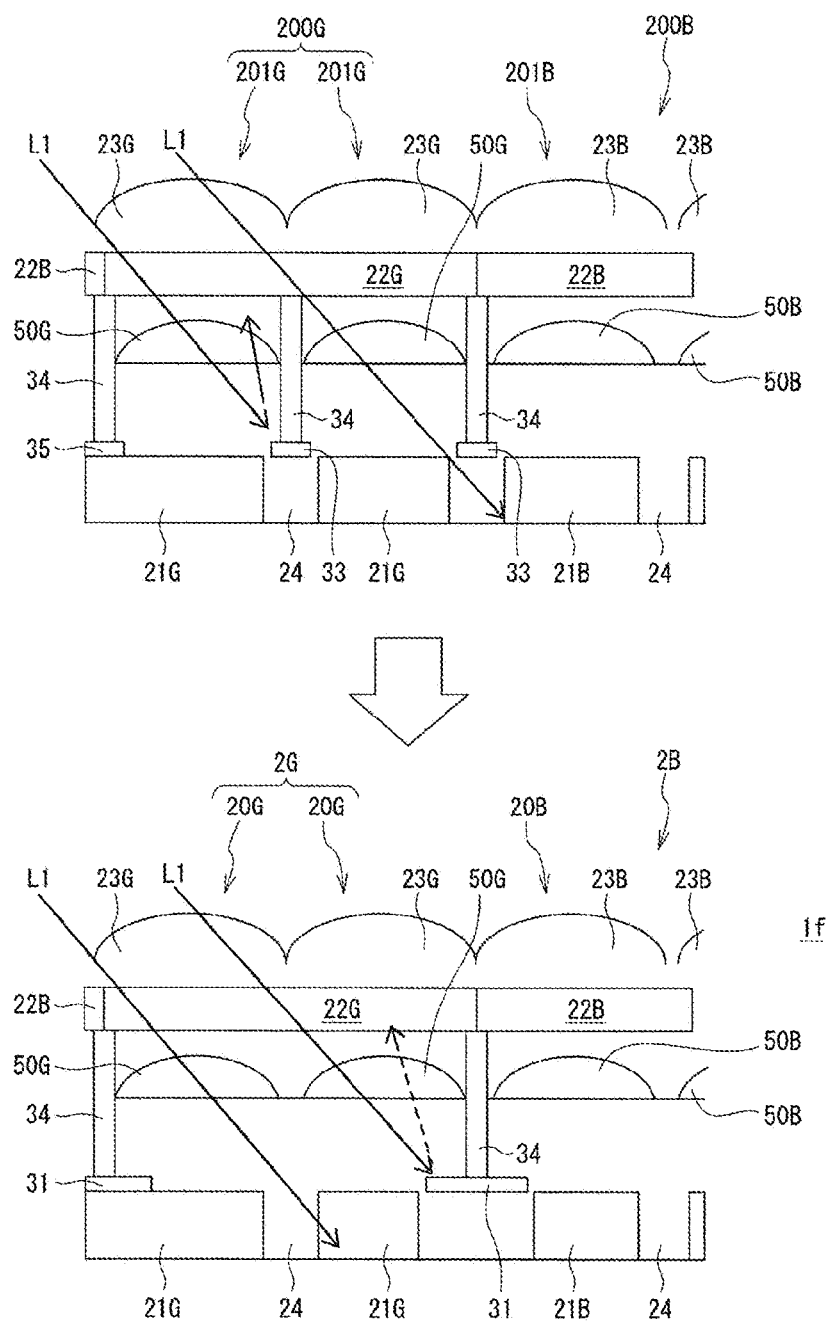
FIG. 18 is a view schematically showing an example of a cross section of a schematic configuration of pixels provided in a solid-state imaging device according to a sixth embodiment of the present disclosure.

FIG. 18 is a view schematically showing a cross section of the green pixel 2G. On a start point side (an upper side) of a thick arrow shown in FIG. 18, a green pixel 200G and a blue pixel 200B provided in a solid-state imaging device having a large-sized wall structure of the related art are shown as a comparative example. On an end point side (a lower side) of the thick arrow, the green pixel 2G and the blue pixel 2B provided in the solid-state imaging device 1f according to the present embodiment are shown. The light entering the solid-state imaging device 1f is refracted at a surface of the on-chip lens or an interface where different constituent elements are in contact with each other, but in FIG. 18, the refraction of light is not shown for the sake of easy understanding.

As shown on the lower side in FIG. 18, the solid-state imaging device 1f includes a metal film 34 formed to overlap the first light shielding region 31 between the green filter (an example of a first color filter) 22G, the blue filter (an example of a second color filter) 22B, and the first light shielding region 31. The green pixel (an example of a first pixel) 2G has an internal lens 50G (an example of an internal lens) arranged to overlap each of the plurality of on-chip lenses 23G between the green filter 22G and the plurality of photoelectric conversion units 21Ga, 12Gb, 21Gc, and 21Gd. Further, the blue pixel (an example of a second pixel) 2B has an internal lens 50B (an example of an internal lens) arranged to overlap each of the plurality of on-chip lenses 23B between the blue filter 22B and the plurality of photoelectric conversion units 21Ba, 12Bb, 21Bc, and 21Bd.

Although not shown, the solid-state imaging device 1f includes a metal film formed to overlap the first light shielding region 31 between the green filter 22G, the red filter (an example of a second color filter) 22R, and the first light shielding region 31. The red pixel (an example of a second pixel) 2R has an internal lens (an example of an internal lens) arranged to overlap each of the plurality of on-chip lenses 23R between the red filter 22R and the plurality of photoelectric conversion units 21Ra, 12Rb, 21Rc, and 21Rd.

The first light shielding region 31 and the metal film 34 are arranged to overlap each other when viewed in a direction orthogonal to the green filter 22G. The metal film 34 is formed in contact with the first light shielding region 31. As a material for forming the metal film 34, for example, tungsten (W), aluminum (Al) or copper (Cu) can be used as in the first light shielding region 31.

As shown on the upper side in FIG. 18, the solid-state imaging device of the related art also has a metal film 35 between green sub pixels 201G as compared with the solid-state imaging device 1f. Further, the solid-state imaging device of the related art has the light shielding region 33 having a width narrower than that of the first light shielding region 31. The light shielding region 33 is also formed below the metal film 35.

The light shielding region 33 provided in the solid-state imaging device of the related art has a narrower width than the first light shielding region 31. Therefore, as shown on the upper side in FIG. 18, some of the light L1 entering the green pixel 200G enters the photoelectric conversion unit 21B of the blue pixel 200B arranged next to the green pixel 200G. This causes color mixing in the solid-state imaging device of the related art.

On the other hand, the solid-state imaging device 1f has the first light shielding region 31 having a width wider than that of the light shielding region 33. Therefore, as shown on the lower side in FIG. 18, some of the light L1 entering the green pixel 2G is reflected by the first light shielding region 31 and thus does not enter the photoelectric conversion unit 21B of the blue pixel 2B arranged next to the green pixel 2G. As a result, the solid-state imaging device 1f can prevent color mixing.

As described above, even if the solid-state imaging device 1f according to the present embodiment has a large-sized wall structure, it is possible to prevent the color mixing between the pixels 2 having different colors by the first light shielding region 31, and thus it is possible to suppress the deterioration of image quality.

Seventh Embodiment

A solid-state imaging device according to a seventh embodiment of the present disclosure will be described with reference to FIG. 19. The solid-state imaging device 1g according to the present embodiment is characterized in that the width of the first light shielding region varies depending on the position of the pixel region. In the description of the present embodiment, the constituent elements having the same operations and functions as those of the solid-state imaging device 1a according to the first embodiment are designated by the same reference signs and the description thereof will be omitted.

Since the solid-state imaging device 1g according to the present embodiment has the same overall configuration as the solid-state imaging device 1a according to the first embodiment, the description thereof will be omitted. Further, the solid-state imaging device 1g includes the pixels 2 having the same configuration as the pixels 2 provided in the solid-state imaging device 1a according to the first embodiment excluding the width of the first light shielding region.

Figure 19:
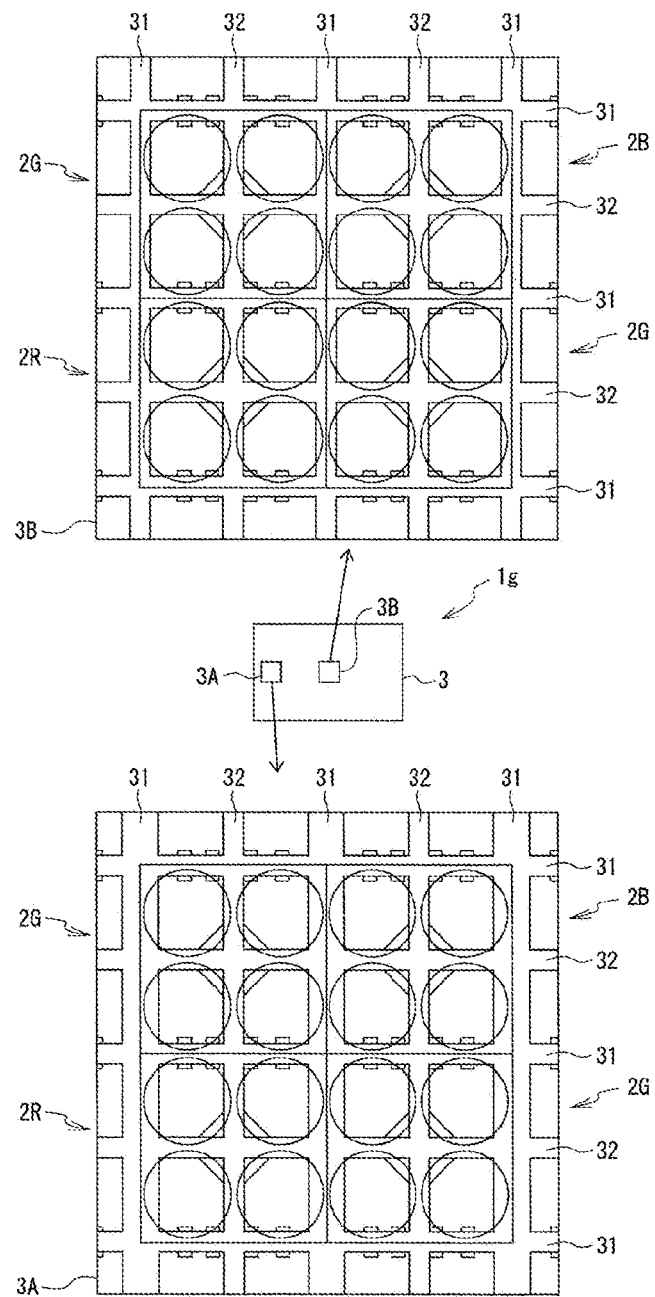
FIG. 19 is a plan view showing an example of a schematic configuration of pixels provided in a solid-state imaging device according to a seventh embodiment of the present disclosure.

As shown in FIG. 19, the solid-state imaging device 1g according to the present embodiment includes the pixel region 3 having a rectangular shape that is longer in the horizontal direction than in the vertical direction and having the green pixel (an example of a first pixel) 2G, and the red pixel 2R and the blue pixel 2B (both are examples of a second pixel) arranged in a predetermined pattern (for example, a Bayer array) in the vertical direction and the horizontal direction. The vertical direction of the pixel region 3 is, for example, a direction substantially parallel to the vertical signal line 9a (see FIG. 1). The horizontal direction of the pixel region 3 is a direction substantially parallel to the selection signal line 9b (see FIG. 1).

A width of the first light shielding region 31 arranged at a short side end portion of the pixel region 3 is wider in a portion parallel to the vertical direction of the pixel region 3 than in a portion parallel to the horizontal direction of the pixel region 3. Specifically, as shown in a region 3A in FIG. 19, the first light shielding region 31 arranged at the short side end portion of the pixel region 3 in the portion parallel to the vertical direction of the pixel region 3 has a wider width than the second light shielding region 32. On the other hand, the first light shielding region 31 arranged at the short side end portion of the pixel region 3 in the portion parallel to the horizontal direction of the pixel region 3 has the same width as the second light shielding region 32.

A width of the first light shielding region 31 arranged at a central portion of the pixel region 3 is narrower than the width of the first light shielding region 31 arranged at the short side end portion of the pixel region 3 in the portion parallel to the vertical direction of the pixel region 3. Specifically, as shown in a region 3B in FIG. 19, the width of the first light shielding region 31 arranged at the central portion of the pixel region 3 is narrower than the width of the first light shielding region 31 shown in the region A in the portion parallel to the vertical direction of the pixel region 3. The first light shielding region 31 arranged at the central portion of the pixel region 3 has the same width as the second light shielding region 32, for example.

The solid-state imaging device 1g may have, for example, a first light shielding region 31 formed point-symmetrically with a midpoint of the pixel region 3 as an axis of symmetry. In a case where the pixel region 3 has a horizontally long shape, the color mixing is more likely to occur at the short side end portion than at the central portion with respect to oblique incidence. Therefore, the solid-state imaging device 1g can improve the color mixing resistance against the oblique incidence by making the line width of the first light shielding region 31 wider at the short side end portion than at the central portion. Further, in the solid-state imaging device 1g, since the width of the first light shielding region 31 is wide only in a region where the color mixing is likely to occur with respect to the oblique incidence, the amount of reflected light of the incident light in the entire pixel region 3 can be reduced, and thus the sensitivity can be improved.

Further, the width of the first light shielding region 31 may be formed to gradually widen from the central portion of the pixel region 3 toward the short side end portion. In this case, the amount of reflected light of the incident light in the entire pixel region 3 can be reduced as compared with a case where the width of all the entire first light shielding regions 31 provided in the pixel region 3 is wider than the width of the second light shielding region 32, and thus the solid-state imaging device 1g can improve the sensitivity.

As described above, the solid-state imaging device 1g according to the present embodiment can improve the color mixing resistance against the oblique incidence and thus can suppress deterioration of image quality. Further, the solid-state imaging device 1g can improve the sensitivity.

Eighth Embodiment

A solid-state imaging device according to an eighth embodiment of the present disclosure will be described with reference to FIG. 20. The solid-state imaging device 1h according to the present embodiment is characterized in that the width of the first light shielding region varies depending on the position of the pixel region. In the description of the present embodiment, the constituent elements having the same operations and functions as those of the solid-state imaging device 1a according to the first embodiment are designated by the same reference signs and the description thereof will be omitted.

Since the solid-state imaging device 1h according to the present embodiment has the same overall configuration as the solid-state imaging device 1a according to the first embodiment, the description thereof will be omitted. Further, the solid-state imaging device 1h includes the pixels 2 having the same configuration as the pixels 2 provided in the solid-state imaging device 1a according to the first embodiment excluding the width of the first light shielding region.

Figure 20:
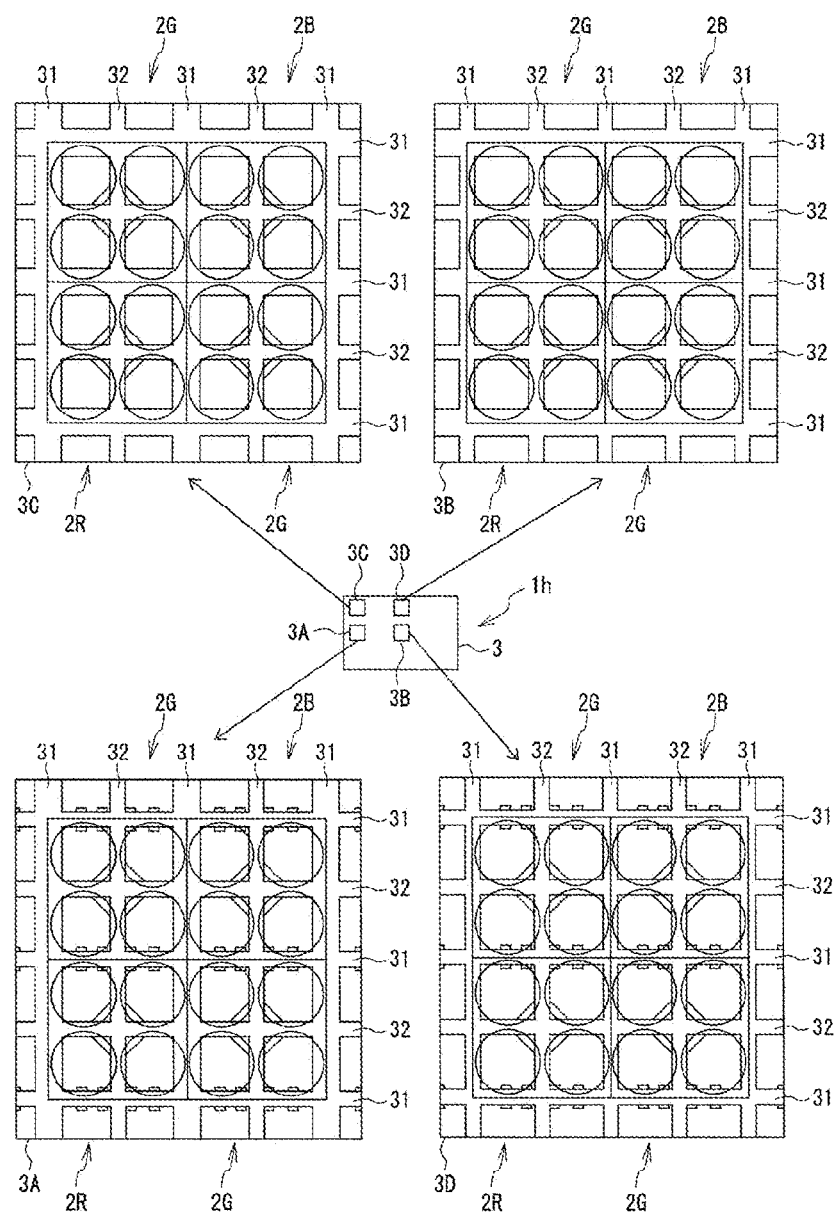
FIG. 20 is a plan view showing an example of a schematic configuration of pixels provided in a solid-state imaging device according to an eighth embodiment of the present disclosure.

As shown in FIG. 20, the solid-state imaging device 1h according to the present embodiment includes the pixel region 3 having a rectangular shape that is longer in the horizontal direction than in the vertical direction and having the green pixel (an example of a first pixel) 2G, and the red pixel 2R and the blue pixel 2B (both are examples of a second pixel) arranged in a predetermined pattern (for example, a Bayer array) in the vertical direction and the horizontal direction. The vertical direction of the pixel region 3 is, for example, a direction substantially parallel to the vertical signal line 9a (see FIG. 1). The horizontal direction of the pixel region 3 is a direction substantially parallel to the selection signal line 9b (see FIG. 1).

In the solid-state imaging device 1h, a width of the first light shielding region 31 arranged at a corner portion of the pixel region 3 is wider than a width of the first light shielding region 31 arranged at a central portion of the pixel region 3. Specifically, as shown in a region 3C and a region 3D in FIG. 20, the width of the first light shielding region 31 arranged at the corner portion (see the region 3C) of the pixel region 3 is wider than the width of the first light shielding region 31 arranged at the central portion (see the region 3D) of the pixel region 3. The first light shielding region 31 arranged at the corner portion of the pixel region 3 has a wider width than the second light shielding region 32, for example. On the other hand, the first light shielding region 31 arranged at the central portion of the pixel region 3 has the same width as the second light shielding region 32, for example.

Further, in the solid-state imaging device 1h, a width of the first light shielding region 31 arranged at a short side end portion of the pixel region 3 excluding the corner portion is wider in a portion parallel to the vertical direction of the pixel region 3 than in a portion parallel to the horizontal direction of the pixel region 3. Specifically, as shown in a region 3A in FIG. 20, the width of the first light shielding region 31 arranged at the short side end portion of the pixel region 3 excluding the corner portion is wider in the portion parallel to the vertical direction of the pixel region 3 than in the portion parallel to the horizontal direction of the pixel region 3. The first light shielding region 31 arranged at the short side end portion of the pixel region 3 excluding the corner portion in the portion parallel to the vertical direction of the pixel region 3 has a wider width than the second light shielding region 32, for example. On the other hand, the first light shielding region 31 arranged at the short side end portion of the pixel region 3 excluding the corner portion in the portion parallel to the horizontal direction of the pixel region 3 has the same width as the second light shielding region 32, for example.

Further, in the solid-state imaging device 1h, a width of the first light shielding region 31 arranged at a long side end portion of the pixel region 3 excluding the corner portion is narrower in a portion parallel to the vertical direction of the pixel region 3 than in a portion parallel to the horizontal direction of the pixel region 3. Specifically, as shown in a region 3D in FIG. 20, the width of the first light shielding region 31 arranged at the long side end portion of the pixel region 3 excluding the corner portion is narrower in the portion parallel to the vertical direction of the pixel region 3 than in the portion parallel to the horizontal direction of the pixel region 3. The first light shielding region 31 arranged at the long side end portion of the pixel region 3 excluding the corner portion in the portion parallel to the horizontal direction of the pixel region 3 has a wider width than the second light shielding region 32, for example. On the other hand, the first light shielding region 31 arranged at the long side end portion of the pixel region 3 excluding the corner portion in the portion parallel to the vertical direction of the pixel region 3 has the same width as the second light shielding region 32, for example.

Further, in the solid-state imaging device 1h, the width of the first light shielding region 31 arranged at the central portion of the pixel region 3 is narrower than a width of the first light shielding region 31 arranged at a long side end portion of the pixel region 3 excluding the corner portion in a portion parallel to the horizontal direction of the pixel region 3. Specifically, as shown in a region 3B, a region 3C, and a region 3D in FIG. 20, the first light shielding region 31 arranged at the central portion (see the region 3B) of the pixel region 3 has a width which is substantially the same as that of the second light shielding region 32, for example. The first light shielding region 31 arranged at the long side end portion (see the region D) of the pixel region 3 excluding the corner portion (see the region 3C) in the portion parallel to the horizontal direction of the pixel region 3 has a wider width than the second light shielding region 32, for example. Therefore, the first light shielding region 31 arranged at the central portion of the pixel region 3 has a narrower width than the first light shielding region 31 arranged at the long side end portion of the pixel region 3 excluding the corner portion in the portion parallel to the horizontal direction of the pixel region 3. Accordingly, the width of the first light shielding region 31 arranged at the central portion of the pixel region 3 is narrower than the width of the first light shielding region 31 arranged at the long side end portion of the pixel region 3 excluding the corner portion in the portion parallel to the vertical direction of the pixel region 3.

Further, in the solid-state imaging device 1h, the width of the first light shielding region 31 arranged at the central portion of the pixel region 3 is narrower than a width of the first light shielding region 31 arranged at a short side end portion of the pixel region 3 excluding the corner portion in a portion parallel to the vertical direction of the pixel region 3. Specifically, as shown in the region 3A, the region B, and the region 3C in FIG. 20, the first light shielding region 31 arranged at the short side end portion (see the region A) of the pixel region 3 excluding the corner portion (see the region 3C) in the portion parallel to the vertical direction of the pixel region 3 has a wider width than the second light shielding region 32, for example. Therefore, the first light shielding region 31 arranged at the central portion (see the region 3B) of the pixel region 3 has a narrower width than the first light shielding region 31 arranged at the short side end portion of the pixel region 3 excluding the corner portion in the portion parallel to the vertical direction of the pixel region 3. Accordingly, the width of the first light shielding region 31 arranged at the central portion of the pixel region 3 is narrower than the width of the first light shielding region 31 arranged at the short side end portion of the pixel region 3 excluding the corner portion in the portion parallel to the vertical direction of the pixel region 3.

The solid-state imaging device 1h may have, for example, a first light shielding region 31 formed point-symmetrically with a midpoint of the pixel region 3 as an axis of symmetry. In the solid-state imaging device, although pupil correction is applied, a main light ray from the on-chip lenses 23R, 23G, and 23B is tilted, and thus color mixing increases at a high image height. Therefore, in the solid-state imaging device 1h according to the present embodiment, the width of the first light shielding region 31 becomes wider toward the high image height (that is, the central portion, the long side end portion, and the short side end portion of the pixel region 3). Further, in the solid-state imaging device 1h, since the width of the first light shielding region 31 is wide only in a region where the color mixing is likely to occur with respect to the oblique incidence, the amount of reflected light of the incident light in the entire pixel region 3 can be reduced, and thus the sensitivity can be improved.

As described above, the solid-state imaging device 1h according to the present embodiment can improve the color mixing resistance against the high image height and thus can suppress deterioration of image quality. Further, the solid-state imaging device 1h can improve the sensitivity.

Although the present disclosure has been described above taking the embodiments as examples, the present disclosure is not limited to the above embodiments and the like, and various modifications are possible. The effects described in the present specification are merely examples. The effects of the present disclosure are not limited to the effects described in the present specification. The present disclosure may have effects other than those described in the present specification.

Further, for example, the present disclosure may have the following configurations.

(1)

A solid-state imaging device including:

a first pixel that has a plurality of photoelectric conversion units sharing a first color filter with each other and a plurality of on-chip lenses;

a second pixel that is arranged adjacent to the first pixel and has a plurality of photoelectric conversion units sharing a second color filter with each other and a plurality of on-chip lenses; and a first light shielding region that is provided between the first pixel and the second pixel.

(2)

The solid-state imaging device according to (1), wherein the first pixel has a first sub pixel having a first photoelectric conversion unit among the plurality of photoelectric conversion units, a second sub pixel having a second photoelectric conversion unit among the plurality of photoelectric conversion units, and a second light shielding region provided between the first sub pixel and the second sub pixel, and wherein a width of the second light shielding region is narrower than a width of the first light shielding region.

(3)

The solid-state imaging device according to (2), wherein the second light shielding region is provided in the first pixel in a case where the first color filter has a color having a lower visual sensitivity than the second color filter.

(4)

The solid-state imaging device according to (2) or (3), wherein the second light shielding region is provided in the first pixel in a case where the first color filter is a color filter having a color having a longer wavelength than the second color filter.

(5)

The solid-state imaging device according to (1), wherein the second pixel has a first sub pixel having a first photoelectric conversion unit among the plurality of photoelectric conversion units and a second sub pixel having a second photoelectric conversion unit among the plurality of photoelectric conversion units and does not have a light shielding region between the first sub pixel and the second sub pixel.

(6)

The solid-state imaging device according to any one of (1) to (5), wherein, when a width of the first light shielding region is defined as w, a pitch between the plurality of on-chip lenses in the first pixel is defined as p1, a height from a virtual plane including a bottom surface of the first light shielding region to a top portion of the on-chip lens closest to the first light shielding region is defined as h1, and an entering length of light into the photoelectric conversion unit provided in the first pixel is defined as d1, the following relational expression is satisfied.

$w > 2 \times ((p1/2) \times d1/(h1+d1))$ (7)

The solid-state imaging device according to any one of (1) to (6), wherein, when a width of the first light shielding region is defined as w, a pitch between the plurality of on-chip lenses in the second pixel is defined as p2, a height from a virtual plane including a bottom surface of the first light shielding region to a top portion of the on-chip lens closest to the first light shielding region is defined as h2, and an entering length of light into the photoelectric conversion unit provided in the second pixel is defined as d2, the following relational expression is satisfied.

$w > 2 \times ((p2/2) \times d2/(h2+d2))$ (8)

The solid-state imaging device according to any one of (1) to (7), further including an insulating film formed to overlap the first light shielding region between the first pixel and the second pixel.

(9)

The solid-state imaging device according to any one of (1) to (8), further including a metal film formed to overlap the first light shielding region between the first color filter, the second color filter, and the first light shielding region, wherein the first sub pixel has a plurality of internal lenses arranged to overlap each of the plurality of on-chip lenses between the first color filter and the plurality of photoelectric conversion units, and wherein the second sub pixel has a plurality of internal lenses arranged to overlap each of the plurality of on-chip lenses between the second color filter and the plurality of photoelectric conversion units.

(10)

The solid-state imaging device according to any one of (1) to (9), further including a pixel region having a rectangular shape that is longer in a horizontal direction than in a vertical direction and having the first pixel and the second pixel arranged in a predetermined pattern in the vertical direction and the horizontal direction, wherein a width of the first light shielding region arranged at a short side end portion of the pixel region is wider in a portion parallel to the vertical direction than in a portion parallel to the horizontal direction.

(11)

The solid-state imaging device according to (10), wherein a width of the first light shielding region arranged at a central portion of the pixel region is narrower than the width of the first light shielding region arranged at the short side end portion of the pixel region in the portion parallel to the vertical direction.

(12)

The solid-state imaging device according to any one of (1) to (9), further including a pixel region having a rectangular shape that is longer in a horizontal direction than in a vertical direction and having the first pixel and the second pixel arranged in a predetermined pattern in the vertical direction and the horizontal direction, wherein a width of the first light shielding region arranged at a corner portion of the pixel region is wider than a width of the first light shielding region arranged at a central portion of the pixel region.

(13)

The solid-state imaging device according to (12), wherein a width of the first light shielding region arranged at a short side end portion of the pixel region excluding the corner portion is wider in a portion parallel to the vertical direction than in a portion parallel to the horizontal direction.

(14)

The solid-state imaging device according to (12) or (13), wherein a width of the first light shielding region arranged at a long side end portion of the pixel region excluding the corner portion is narrower in a portion parallel to the vertical direction than in a portion parallel to the horizontal direction.

(15)

The solid-state imaging device according to (13), wherein the width of the first light shielding region arranged at the central portion of the pixel region is narrower than a width of the first light shielding region arranged at a long side end portion of the pixel region excluding the corner portion in a portion parallel to the horizontal direction.

(16)

The solid-state imaging device according to (13), wherein the width of the first light shielding region arranged at the central portion of the pixel region is narrower than the width of the first light shielding region arranged at a short side end portion of the pixel region excluding the corner portion in the portion parallel to the vertical direction.

Those skilled in the art can conceive of various modifications, combinations, sub-combinations, and changes depending on design requirements and other factors, but it is understood that these are included in the attached claims and their equivalents.

REFERENCE SIGNS LIST 1a, 1b, 1c, 1d, 1e, 1f, 1g, 1h Solid-state imaging device
2 Pixel
2B, 200B Blue pixel
2G, 200G Green pixel
2R Red pixel
3 Pixel region
3A, 3B, 3C, 3D Region
4 Vertical drive circuit
5 Column signal processing circuit
6 Horizontal drive circuit
7 Output circuit
8 Control circuit
9a Vertical signal line
9b Selection signal line
10 Horizontal signal line
11 Support substrate
12 Substrate
13 Wiring layer
14 Interlayer insulating film
15 Wiring
17 Gate insulating film
20B Blue sub pixel
20G, 201G Green sub pixel
20R Red sub pixel
21B, 21G, 21R Photoelectric conversion unit
22B Blue filter
22G Green filter
22R Red filter
23B, 23G, 23R On-chip lens
24 Insulating film
25 Flattening film
26 Pixel separating part
29 p-well layer
30 Reverse angle
30B, 30G, 30R Floating diffusion (FD) part
31 First light shielding region
32 Second light shielding region
33 Light shielding region
34, 35 Metal film
40 Element separating part
41 Insulating film
42 Fixed charge film
43 Groove portion
50B, 50G Internal lens
211 n-type semiconductor region
212, 213 p-type semiconductor region
311 Bottom surface
GE Gate electrode
GTr2, RTr2 Reset transistor
GTr3, RTr3 Amplification transistor
GTr4, RTr4 Selection transistor
GTr11, GTr12, GTr13, GTr14, RTr11, RTr12, RTr13, RTr14 Transfer transistor

The invention claimed is:

1. A solid-state imaging device, comprising:
a first pixel includes a plurality of photoelectric conversion units and a plurality of on-chip lenses, wherein the plurality of photoelectric conversion units of the first pixel shares a first color filter;
a second pixel adjacent to the first pixel, wherein
the second pixel includes a plurality of photoelectric conversion units and a plurality of on-chip lenses, and
the plurality of photoelectric conversion units of the second pixel shares a second color filter; and
a first light shielding region between the first pixel and the second pixel, wherein
in a case where a width of the first light shielding region is defined as w,
a pitch between the plurality of on-chip lenses in the first pixel is defined as p1,
a height from a virtual plane including a bottom surface of the first light shielding region to a top portion of an on-chip lens of the plurality of on-chip lenses in the first pixel closest to the first light shielding region is defined as h1,
an entering length of light into the plurality of photoelectric conversion units in the first pixel is defined as d1, and
the following relational expression is satisfied:

$$w > 2 \times ((p1/2) \times d1/(h1+d1)).$$

2. The solid-state imaging device according to claim 1, wherein the first pixel has
a first sub pixel having a first photoelectric conversion unit among the plurality of photoelectric conversion units, a second sub pixel having a second photoelectric conversion unit among the plurality of photoelectric conversion units, and
a second light shielding region between the first sub pixel and the second sub pixel, and
a width of the second light shielding region is narrower than the width of the first light shielding region.

3. The solid-state imaging device according to claim 2, wherein the second light shielding region is in the first pixel in a case where a visual sensitivity of a color of the first color filter is lower than a visual sensitivity of a color of the second color filter.

4. The solid-state imaging device according to claim 2, wherein the second light shielding region is in the first pixel in a case where a wavelength of a color of the first color filter is longer than a wavelength of a color of the second color filter.

5. The solid-state imaging device according to claim 1, wherein the second pixel has
a first sub pixel having a first photoelectric conversion unit among the plurality of photoelectric conversion units, and
a second sub pixel having a second photoelectric conversion unit among the plurality of photoelectric conversion units, and
the second pixel does not have a second light shielding region between the first sub pixel and the second sub pixel.

6. The solid-state imaging device according to claim 1, wherein in a case where the width of the first light shielding region is defined as w, a pitch between the plurality of on-chip lenses in the second pixel is defined as p2,
a height from a virtual plane including the bottom surface of the first light shielding region to a top portion of an on-chip lens of the plurality of on-chip lenses in the second pixel closest to the first light shielding region is defined as h2,
an entering length of light into the plurality of photoelectric conversion units in the second pixel is defined as d2, and
the following relational expression is satisfied:

$$w > 2 \times ((p2/2) \times d2/(h2+d2)).$$

7. The solid-state imaging device according to claim 1, further comprising an insulating film that overlaps the first light shielding region between the first pixel and the second pixel.

8. The solid-state imaging device according to claim 1, further comprising a metal film that overlaps the first light shielding region between the first color filter, the second color filter, and the first light shielding region, wherein
the first pixel has a plurality of internal lenses that overlaps each of the plurality of on-chip lenses between the first color filter and the plurality of photoelectric conversion units, and
the second pixel has a plurality of internal lenses that overlaps each of the plurality of on-chip lenses between the second color filter and the plurality of photoelectric conversion units.

9. The solid-state imaging device according to claim 1, further comprising a pixel region, wherein
the pixel region has a rectangular shape that is longer in a horizontal direction than in a vertical direction,
the pixel region has the first pixel and the second pixel arranged in a specific pattern in the vertical direction and the horizontal direction, the width of the first light shielding region is wider in a portion parallel to the vertical direction than in a portion parallel to the horizontal direction, and
the first light shielding region is at a short side end portion of the pixel region.

10. The solid-state imaging device according to claim 9, wherein the width of the first light shielding region at a central portion of the pixel region is narrower than the width of the first light shielding region at the short side end portion of the pixel region in the portion parallel to the vertical direction.

11. The solid-state imaging device according to claim 1, further comprising a pixel region, wherein
the pixel region has a rectangular shape that is longer in a horizontal direction than in a vertical direction,
the pixel region has the first pixel and the second pixel in a specific pattern in the vertical direction and the horizontal direction, and
the width of the first light shielding region at a corner portion of the pixel region is wider than the width of the first light shielding region at a central portion of the pixel region.

12. The solid-state imaging device according to claim 11, wherein the width of the first light shielding region at a short side end portion of the pixel region, that excludes the corner portion, is wider in a portion parallel to the vertical direction than in a portion parallel to the horizontal direction.

13. The solid-state imaging device according to claim 12, wherein the width of the first light shielding region at the central portion of the pixel region is narrower than the width of the first light shielding region at a long side end portion of the pixel region that excludes the corner portion in the portion parallel to the horizontal direction.

14. The solid-state imaging device according to claim 12, wherein the width of the first light shielding region at the central portion of the pixel region is narrower than the width of the first light shielding region at the short side end portion of the pixel region that excludes the corner portion in the portion parallel to the vertical direction.

15. The solid-state imaging device according to claim 11, wherein the width of the first light shielding region at a long side end portion of the pixel region, that excludes the corner portion, is narrower in a portion parallel to the vertical direction than in a portion parallel to the horizontal direction.

16. A solid-state imaging device, comprising:
a first pixel includes a plurality of photoelectric conversion units and a plurality of on-chip lenses, wherein the plurality of photoelectric conversion units of the first pixel shares a first color filter;
a second pixel adjacent to the first pixel, wherein
the second pixel includes a plurality of photoelectric conversion units and a plurality of on-chip lenses, and
the plurality of photoelectric conversion units of the second pixel shares a second color filter; and
a first light shielding region between the first pixel and the second pixel, wherein in a case where a width of the first light shielding region is defined as w,
a pitch between the plurality of on-chip lenses in the first pixel is defined as p2,
a height from a virtual plane including a bottom surface of the first light shielding region to a top portion of an on-chip lens of the plurality of on-chip lenses in the first pixel closest to the first light shielding region is defined as h2, an entering length of light into the plurality of photo-electric conversion units in the first pixel is defined as d2, and the following relational expression is satisfied:

$$w > 2 \times ((p2/2) \times d2/(h2+d2)).$$

* * * * *